United States Patent
Fecteau et al.

(10) Patent No.: US 7,609,778 B2
(45) Date of Patent: Oct. 27, 2009

(54) METHODS, APPARATUS, AND SYSTEMS FOR REDUCING INTERFERENCE ON NEARBY CONDUCTORS

(75) Inventors: Karl Fecteau, Boucherville (CA); Claude Thibeault, Brossard (CA); Yvon Savaria, Montreal (CA); Yves Blaquiere, Chambly (CA); Jean-Jacques Laurin, Montreal (CA); Zhong-Fang Jin, Montreal (CA)

(73) Assignee: Richard S. Norman, Montreal, Québec (CA)

( * ) Notice: Subject to any disclaimer, the term of this patent is extended or adjusted under 35 U.S.C. 154(b) by 830 days.

(21) Appl. No.: 10/022,856

(22) Filed: Dec. 20, 2001

(65) Prior Publication Data

US 2003/0117184 A1    Jun. 26, 2003

(51) Int. Cl.
*H01L 25/34* (2006.01)
(52) U.S. Cl. .................... 375/288; 375/289; 375/290
(58) Field of Classification Search ................ 375/257, 375/258, 288, 219
See application file for complete search history.

(56) References Cited

U.S. PATENT DOCUMENTS

| | | | |
|---|---|---|---|
| 5,101,347 A | 3/1992 | Balakrishnan et al. | |
| 5,815,031 A | 9/1998 | Tan et al. | |
| 5,886,943 A | 3/1999 | Sekiguchi et al. | |
| 5,892,981 A | 4/1999 | Wiggers | |
| 5,994,766 A | 11/1999 | Shenoy et al. | |
| 5,994,946 A | 11/1999 | Zhang | |
| 6,008,705 A | 12/1999 | Ghoshal | |
| 6,015,300 A | 1/2000 | Schmidt, Jr. et al. | |
| 6,081,146 A | 6/2000 | Shiochi et al. | |
| 6,110,221 A | 8/2000 | Pai et al. | |
| 6,114,890 A | 9/2000 | Okajima et al. | |
| 6,128,337 A * | 10/2000 | Schipper et al. | 375/229 |
| 6,128,347 A * | 10/2000 | Nomura | 375/257 |
| 6,184,702 B1 | 2/2001 | Takahashi et al. | |
| 6,611,538 B1 * | 8/2003 | Malerevich et al. | 370/503 |
| 2005/0069041 A1 * | 3/2005 | Lincoln | 375/257 |

OTHER PUBLICATIONS

Mikazuki, T.; Matsui, N.;, "Statistical design techniques for high-speed circuit boards with correlated structure distributions", IEEE, Transactionon components, Packaging and Manufacturing technology, vol. 14, Issue 3, Sep. 1991, pp. 512-517☐☐.*

Mizuno et al, "Clock Distribution Networks with On-Chip Transmission Lines", IEEE International Conference, Jun. 5-7, 2000, pp. 3-5.*

(Continued)

*Primary Examiner*—Jay K. Patel
*Assistant Examiner*—Qutub Ghulamali
(74) *Attorney, Agent, or Firm*—Ogilvy Renault LLP

(57) ABSTRACT

In a method of data transmission according to one embodiment of the invention, data transitions on adjacent conductors are separated in time. In a method of data transmission according to another embodiment of the invention, signals on adjacent conductive paths pass through different alternating sequences of inversions and regenerations. In a method of data transmission according to a further embodiment of the invention, data transitions having the same clock dependence are separated in space.

44 Claims, 36 Drawing Sheets

OTHER PUBLICATIONS

Ismail et al., Repeater Insertion in Tree Structured Inductive Interconnect, Proceedings of the 1999 International Conference on Computer-aided Design, Nov. 1999, pp. 420-424.

Ismail et al., Effects of Inductance on the Propagation Delay and Repeater Insertion in VLSI Circuits, Proceedings of the 36th ACM/IEEE Conference on Design Automation Conference, Jun. 1999, 4 pages.

Alpert et al., Buffer Insertion With Accurate Gate and Interconnect Delay Computation, Proceedings of the 36th ACM/IEEE Conference on Design Automation Conference, Jun. 1999, 6 pages.

Alpert et al., Buffer Insertion for Noise and Delay Optimization, Proceedings of the 35th annual conference on Design Automation Conference, May 1998, pp. 362-367.

Davari et al., CMOS Scaling for High Performance and Low Power—The Next Ten Years, Proceedings of the IEEE, vol. 83, No. 4, Apr. 1995, pp. 595-606.

Nose et al., Two Schemes to Reduce Interconnect Delay in Bi-directional and Uni-directional Buses, 2001 Symposium on VLSI Circuits, Digest of Technical Papers, pp. 193-194.

PCB Design Guidelines for Reduced EMI, Texas Instruments, SZZA009, Nov. 1999, pp. i-iv and 1-19.

Sato et al., A 5-Gbyte/s Data-Transfer Scheme With Bit-to-Bit Skew Control For Synchronous DRAM, IEEE Journal of Solid State Circuits, vol. 34, No. 5, May 1999, pp. 653-660.

* cited by examiner

METHODS, APPARATUS, AND SYSTEMS FOR REDUCING INTERFERENCE ON NEARBY CONDUCTORS

BACKGROUND

1. Field of the Invention

The present invention relates to information transmission. More specifically, the present invention relates to information transmission along conductive structures.

2. Background Information

Buses of parallel conductors are commonly used on circuit boards to carry data from one location to another. Problems associated with the use of such buses include delays incurred during propagation of the data signals and interference due to coupling of the conductors with one another.

Recently, it has become desirable to enable the use of buses of parallel conductors on small-scale structures such as within an integrated circuit ('chip'). While the propagation delay may be minimal in such applications, undesirable coupling effects become more problematic. For example, capacitive coupling may occur between the parallel conductors, contributing to an increased impedance at high frequencies that limits bandwidth and distorts signal features. Such problems may impose undesirable limits on the maximum clock speed, the minimum size and separation of the conductors, and/or the maximum length of the bus in a particular application.

Timing considerations are especially critical in high-speed integrated circuits currently under development. In these circuits the time between state changes is minimal, and any fluctuation in the transition times may cause a delay that increases the error rate of the chip and decreases chip performance. In a chip clocked at 900 megahertz, for example, each cycle has a duration of only 1.1 nanosecond. If the time required to propagate a state transition across a transmission line is longer than a clock cycle, then the clock speed must be reduced.

As the conductors become more narrow and closer together, and as the time between state transitions decreases (e.g. as the clock speed increases), interference mechanisms that have negligible effects in other applications become limiting. In a 0.18-micron process, for example, with a pitch of 0.4 microns per wire, coupling effects may impede operation at any speed above a few hundred megahertz. For such reasons, chip designers commonly avoid long runs of parallel conductors in their designs.

One effect of coupling interference is an alteration of state transitions as they propagate over the conductors, resulting in a time skew of the signals being transmitted. When a new value is clocked onto a transmission line, an opposite current is induced in an adjacent (victim) transmission line. This induced current (or 'crosstalk') causes the skewing of a signal being transmitted on the victim line.

Timing within a circuit or assembly may be of critical importance: for example, when circuitry at the emitting and/or receiving sides of the transmission line is controlled by a clock (such as within an application-specific integrated circuit or 'ASIC'). In such cases, an altered rise time of a state transition may result in a loss of synchronization between different parts of the circuit and the failure of the chip to perform properly. For example, a skew in rise time may cause a state change to be detected at the receiving side at a different time than was intended because the threshold voltage was reached before or after the intended time.

One method of reducing the effect of crosstalk among signals on parallel conductors includes increasing the power of the signal before transmission. As a result of recent advancements in integrated circuit technologies, however, this method has become outdated. Reduction in integrated circuit feature dimensions, for example, require a consequent reduction in the power supply voltages in order to maintain acceptably low electric field intensities.

An alternative approach to reducing the effect of crosstalk is to shield each transmission line individually in order to reduce the degree of crosstalk between adjacent lines. However, this method is also not viable for chip design because such shielding reduces the amount of surface area available on the chip for transmission lines and other circuit elements. A method of adding additional lines with balanced current and voltage values to counteract the effects of crosstalk and increase the distance between adjacent signal lines suffers from the same problem, as the additional lines will also consume surface area on the chip.

Repeaters have been used along transmission lines to decrease the total transmission time to a level at which the skew of the signal is acceptable. In other words, because delay may be due to both the skewing of the state transition and the propagation time, a reduction in the propagation time may reduce the total delay to an acceptable level. Again, however, such a method requires additional surface area on the chip (for the repeaters). Although methods exist to minimize the amount of space required for the repeaters, space limitations are still of major concern to chip designers. Additionally, the signals outputted by the repeaters may still interfere with signals on nearby conductors.

Reductions of scale and increased speeds associated with new integrated circuit designs require new and innovative techniques to reduce interference during information transmission.

SUMMARY

In a method of data transmission according to one embodiment of the invention, data transitions on adjacent conductors are separated in time. One such method of data transmission includes receiving a plurality of sets of input signals, each input signal having a series of state transitions synchronized to a data clock signal that has a period T_CLK.

This method also includes transmitting a corresponding plurality of sets of output signals (in one example, the receiving and transmitting occur on the same semiconductor substrate). Each output signal corresponds to one of the input signals of the corresponding set and has a series of state transitions corresponding to the series of state transitions of that input signal. For example, each state transition of an output signal may correspond to a different state transition of the corresponding input signal.

Each output signal also passes along a corresponding one of a plurality of conductive paths. Adjacent conductive paths that each carry an output signal of one set are separated by at least one conductive path that carries a signal of another set. In one example, each conductive path includes a buffer.

Each conductive path may include a corresponding one of a plurality of transmission lines. For example, one of the transmission lines may carry a clock signal based on the data clock signal. In another example, each transmission line may include an alternating series of inverting and non-inverting buffers.

In another example, each output signal from one set is transmitted from a first end of the corresponding conductive path to a second end, while each output signal from another set is transmitted from a second end of the corresponding conductive path to a first end.

A time between a state transition on an input signal of one set and the corresponding state transition on the corresponding output signal is designated as T1. A time between a state transition on an input signal of another set and the corresponding state transition on the corresponding output signal is designated as T2. Time T1 exceeds time T2 by a delay period T_DLY. One one hand, the delay period is less than the clock period T_CLK. On the other hand, the delay period is at least twice as long as a rise time of the data clock signal.

In a method of data transmission according to another embodiment of the invention, signals on adjacent conductive paths pass through different sequences of inversions and regenerations. In examples of such a method, each sequence is alternating and/or opposite to the other sequence. In a system for data transmission, adjacent conductive paths (e.g. parallel transmission lines) include alternating series of inverting and non-inverting buffers.

In a method of data transmission according to a further embodiment of the invention, data transitions having the same clock dependence are separated in space. In one example, a first set of signals is transmitted in one direction on a first set of parallel conductors, and a second set of signals is transmitted in the opposite direction on a second set of parallel conductors that is interleaved with the first set. The transmissions in both directions may occur on the same semiconductor substrate. Moreover, a propagation delay of a state transition across one of the parallel conductors may be less than a time interval between consecutive state transitions on that conductor.

Additional embodiments of the invention include combinations of the above-mentioned embodiments, data transmitters, data receivers, systems including data transmitters and receivers, and systems including more than one data transmitter.

DETAILED DESCRIPTION

Signal transmission on sets of conductors may be performed in several different contexts. Between circuit units or assemblies, for example, signals may be transmitted across distances of centimeters or meters on a ribbon cable or another cable having parallel conductors. In a printed circuit board, signals may be transmitted on parallel conductive traces across distances of millimeters or centimeters. In a semiconductor chip, signals may be transmitted across distances of millimeters or microns on parallel conductive paths or structures that may be formed (e.g. deposited or etched) on a substrate.

As the characteristics of the signals (such as clock speed) change, effects that were negligible or undetectable in another application may become significant or even limiting. As signal frequencies increase, for example, capacitive effects may allow conduction between nearby conductors, resulting in crosstalk between signals.

Conductor dimensions may include the length, width, and thickness of each conductor; the feature pitch (characterizing the separation between conductors as measured on the substrate surface); and the vertical separation between conductors. As conductor dimensions and/or relations between those dimensions change, effects that were negligible or undetectable in another application may become significant or even limiting.

In wafer-scale-integration applications, for example, conductive paths less than one-half micron wide (and less than one-half micron apart) may extend in parallel buses that are dozens of centimeters long (i.e. for a length-to-width ratio of $10^6$ or more). In one such application, a number of interconnected cells are fabricated on a single semiconductor substrate that may have a diameter of ten to thirty centimeters. One structure of this class (also called large-area integrated circuits or LAICs) holds an array of tens to thousands of cells that communicate over buses having dozens of conductive paths and lengths of ten to thirty centimeters. In one such example, a bus has forty parallel conductive paths and a length of up to twelve inches.

The signals transmitted on a set of conductors may have several different forms. For example, a portion of the set of conductors may form a parallel signal bus, with each conductor carrying a designated bit of a multi-bit information value (e.g. a byte or word). In another example, one or more of the conductors may carry data values serially. In a further example, one or more of the conductors may carry other information such as parity or other error-control information, source and/or destination information, control values, a clock signal, etc.

In a method for reducing interaction between signals on nearby conductors according to one embodiment of the invention, data transitions on adjacent conductors are separated in time.

Figure 1:
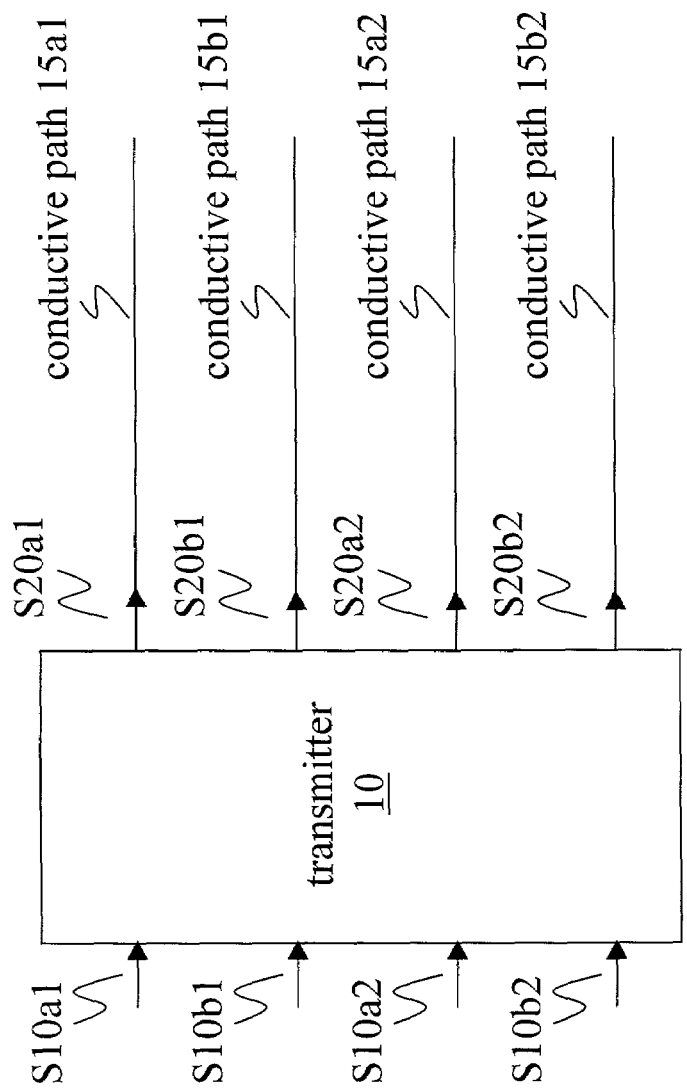
FIG. 1 is a block diagram showing an application of a transmitter 10 according to an embodiment of the invention.

FIG. 1 shows a block diagram of an application of an implementation 10 of a transmitter according to an embodiment of the invention. Transmitter 10 receives two sets of input signals S10a, S10b and transmits two sets of corresponding output signals S20a, S20b on a set of conductive paths 15. In an exemplary implementation, conductive paths 15 are parallel to one another.

A time T1 is defined as the period between a state transition on an input signal S10b and the corresponding state transition on the corresponding output signal S20b. A time T2 is defined as the period between a state transition on an input signal S10a and the corresponding state transition on the corresponding output signal S20a. In the application shown in FIG. 1, time T2 exceeds time T1 by a delay period T_DLY.

Figure 2:
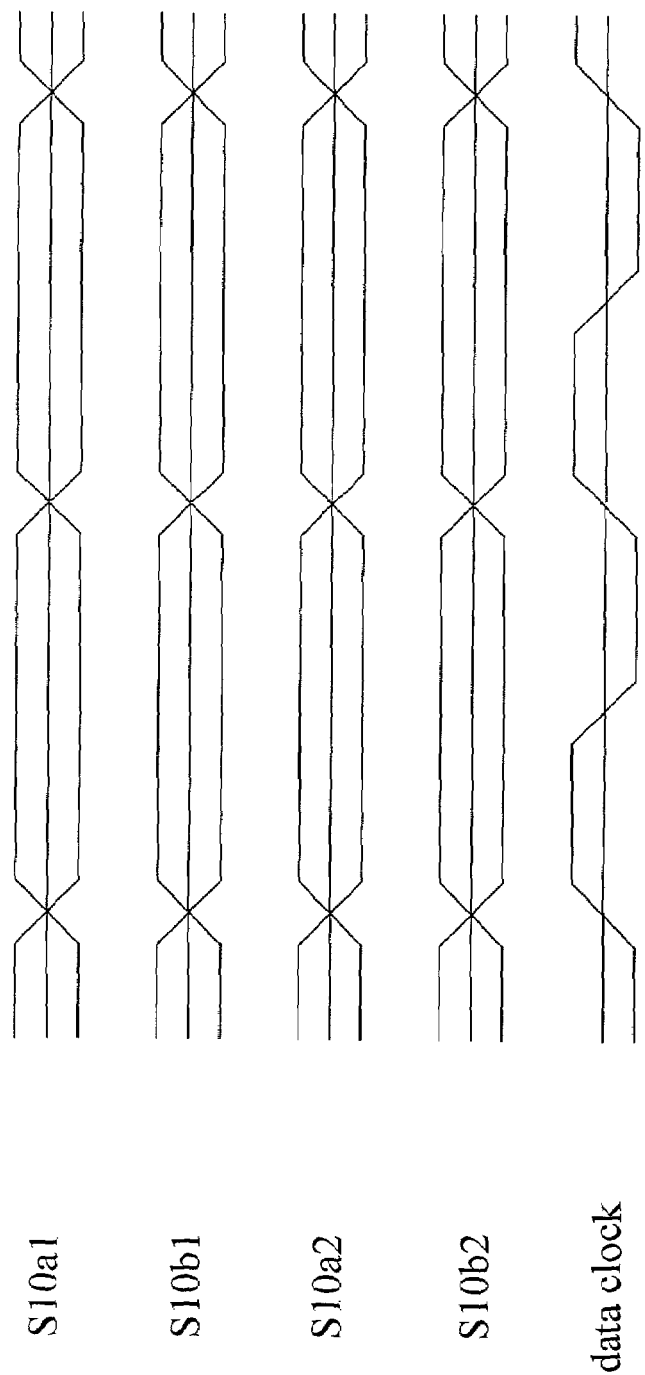
FIG. 2 is an exemplary illustration of time relations between signals in the application of FIG. 1.

FIG. 2 shows a timing diagram for an exemplary application of transmitter 10 as shown in FIG. 1. In this example, each signal S10 carries a series of binary values, with a transition from one value to the other being indicated by a state transition synchronous to a rising edge of a data clock signal. Relations between signals as shown in FIG. 2 are presented by way of example only and are not intended to represent limitations on the practice of the invention or of the application shown in FIG. 1.

Figure 3:
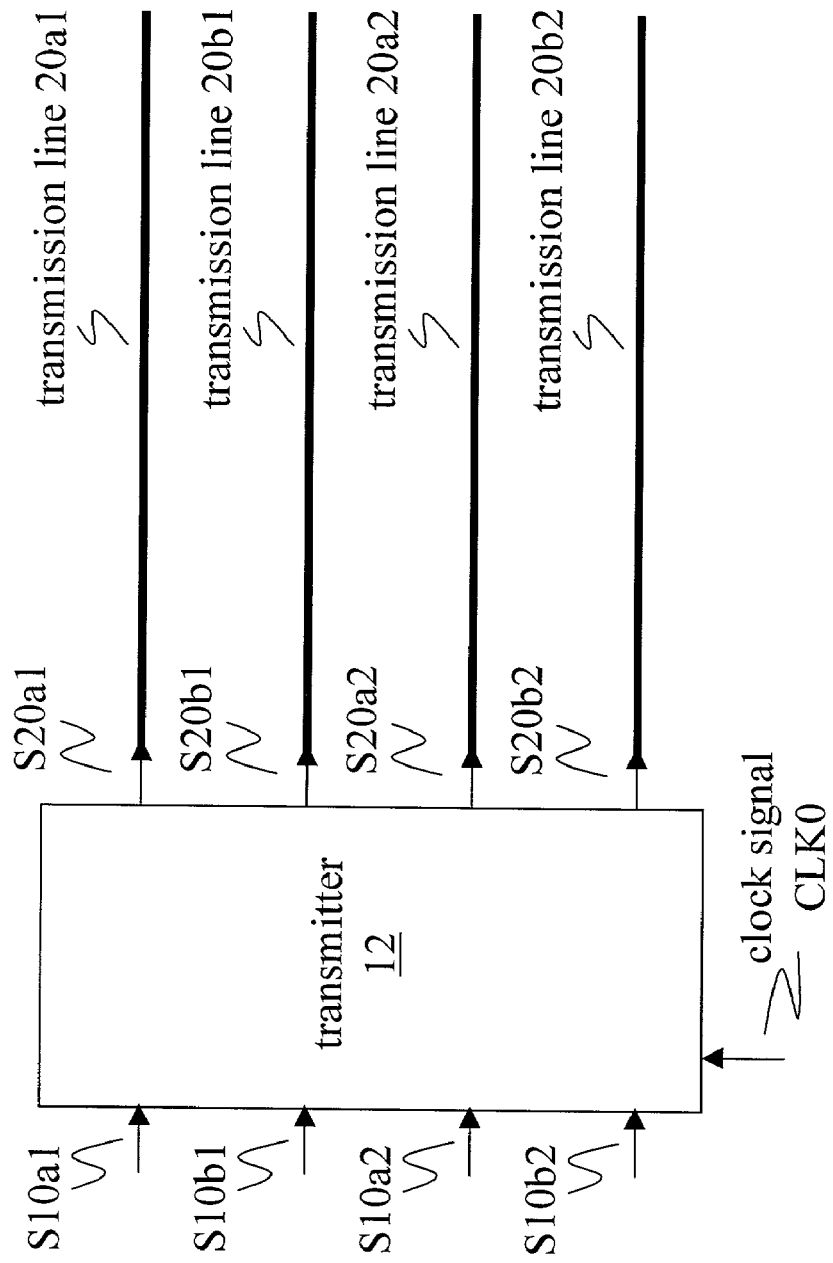
FIG. 3 is a block diagram of an application of an implementation 12 of a transmitter 10 according to an embodiment of the invention.

FIG. 3 shows a block diagram of an application of an implementation 12 of transmitter 10 according to an embodiment of the invention. In this application, transmitter 12 transmits each output signal S20 on a corresponding one of a set of parallel transmission lines 20. In one example, one or more of transmission lines 20 may include one or more buffers. These buffers (or repeaters) may be used to regenerate the signal and preserve signal bandwidth.

Transmitter 12 also receives a clock signal CLK0. Clock signal CLK0 may have a duty cycle of 50% with substantially equal rise and fall times, although such features are not required for practice of the invention. In one example, clock signal CLK0 has a period of 8 nanoseconds (ns) and a rise time of 1 ns.

Figure 4:
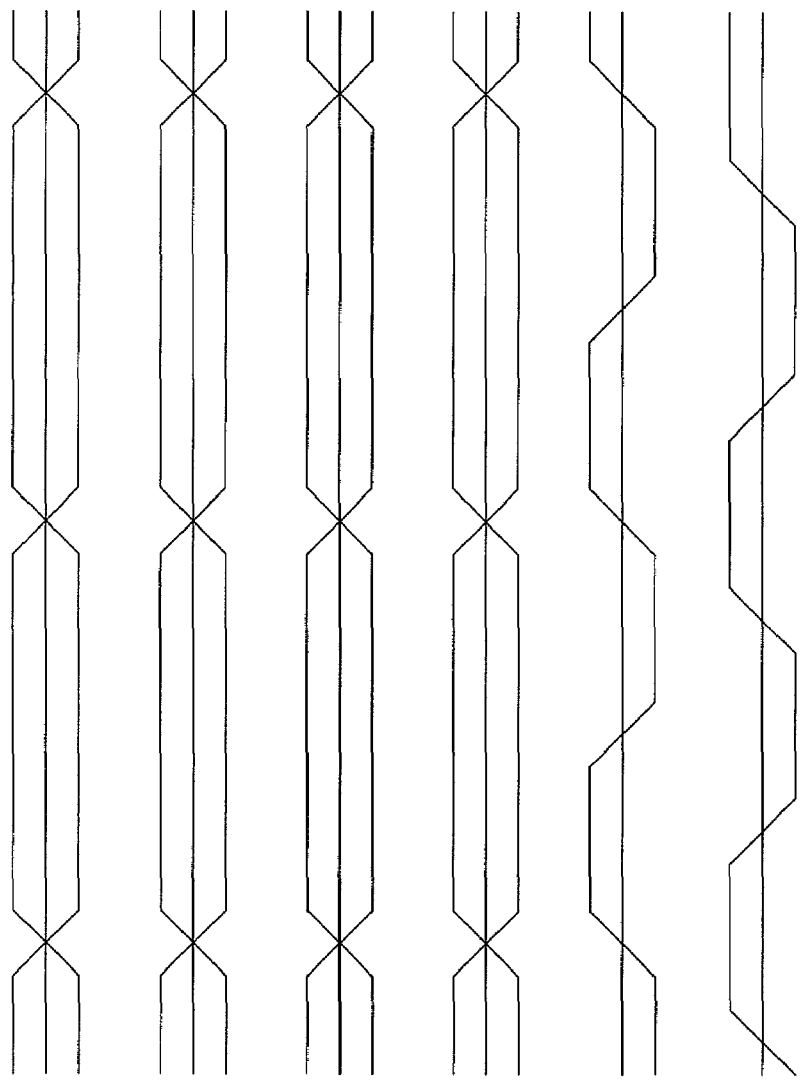
FIG. 4 is an exemplary illustration of time relations between signals in the application of FIG. 3.

FIG. 4 shows a timing diagram for an exemplary application of transmitter 12 as shown in FIG. 3. In this example, clock signal CLK0 has the same frequency as the data clock signal. In other applications, the data clock may be the same as clock signal CLK0. In further applications, one or more of the input signals S10 may be timed according to a different frequency or offset than another of the input signals S10. Relations between signals as shown in FIG. 4 are presented by way of example only and are not intended to represent limitations on the practice of the invention or of the implementation shown in FIG. 3.

In an exemplary implementation, delay period T_DLY is less than the period T_CLK of the data clock signal. In a further example, delay period T_DLY is at least two times the length of the rise time of the data clock signal.

Figure 5:
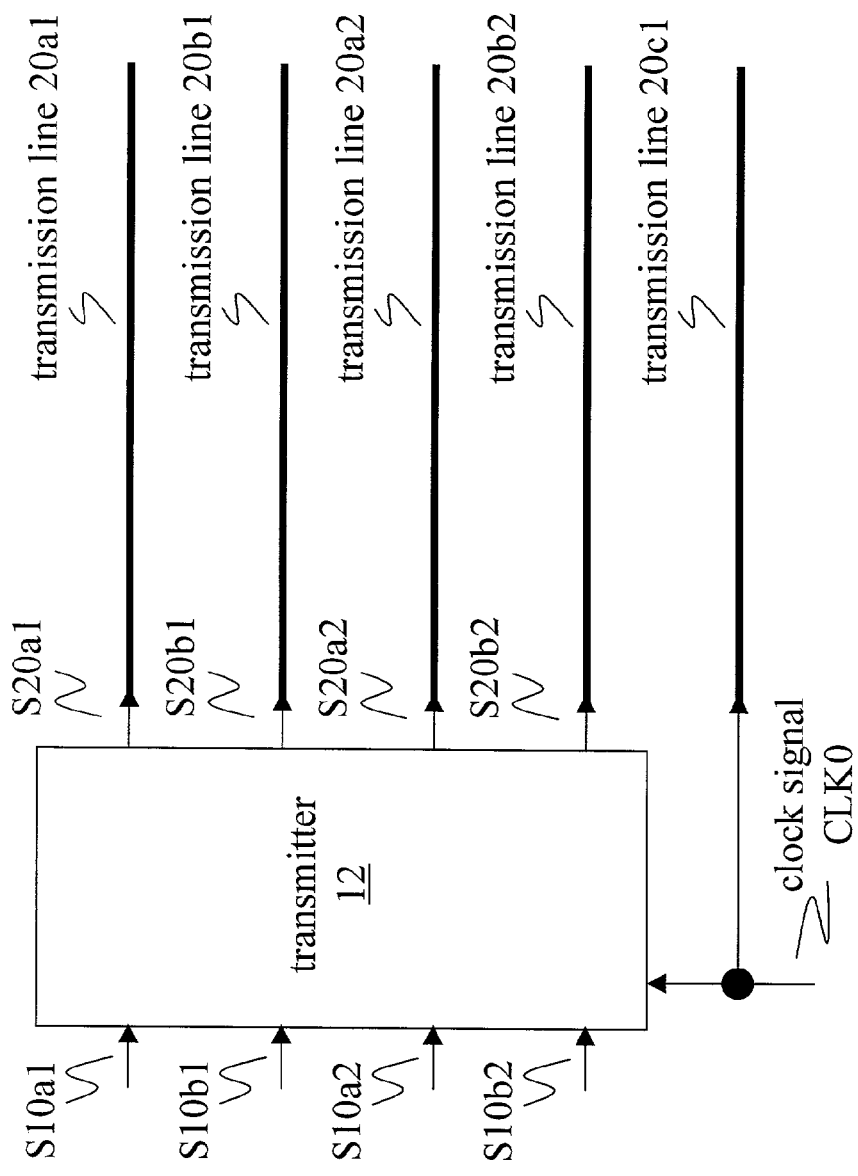
FIG. 5 is a block diagram of an application of an implementation 12 of a transmitter 10 according to an embodiment of the invention.

FIG. 5 shows a block diagram of an application of an implementation 12 of transmitter 10 according to an embodiment of the invention. In this application, clock signal CLK0 is transmitted on a transmission line 20c1 parallel to the transmission lines 20 that carry output signals S20. In another application, transmitter 12 transmits clock signal CLK0 onto transmission line 20c1.

Figure 6:
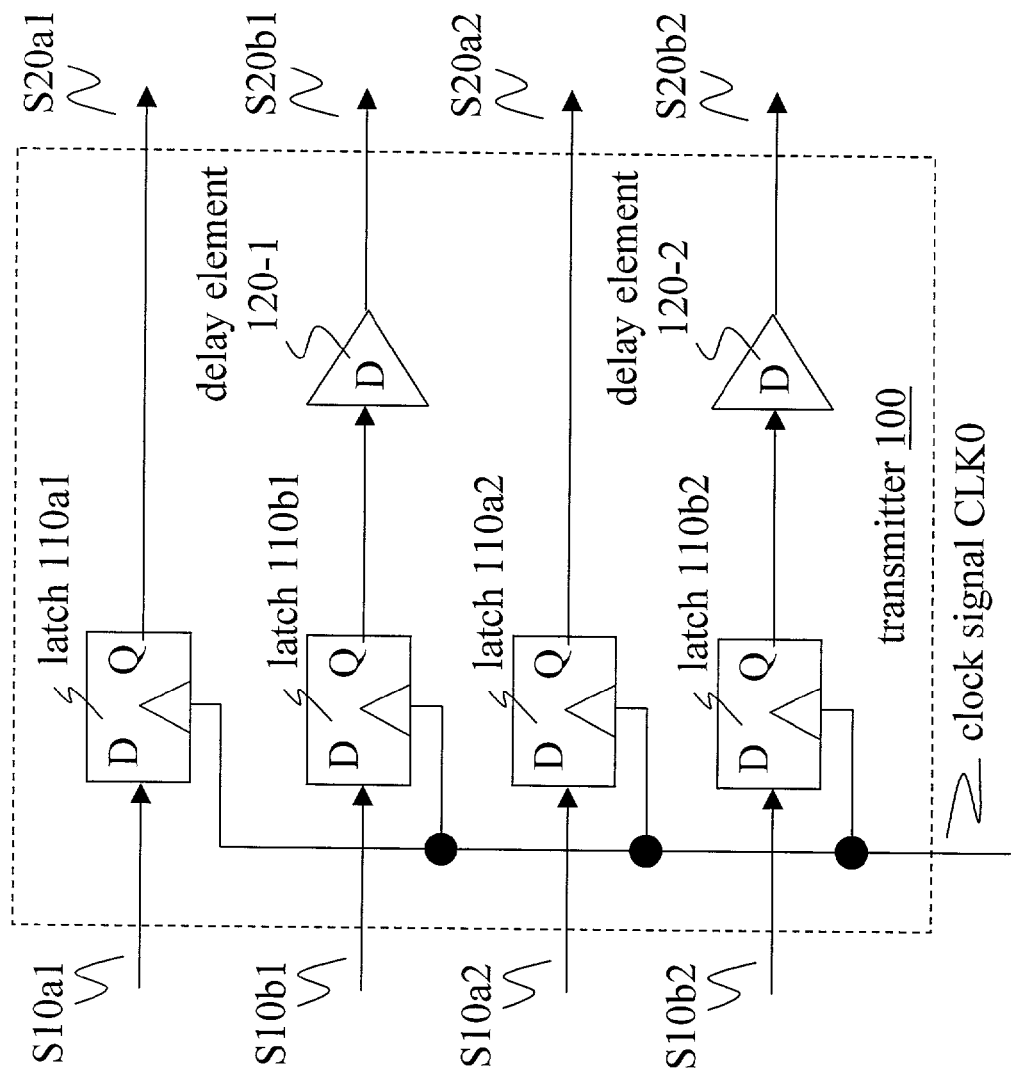
FIG. 6 is a block diagram of an implementation 100 of a transmitter 10 according to an embodiment of the invention.

FIG. 6 shows a block diagram of an implementation 100 of transmitter 10. Transmitter 100 includes a set of first latches 110a that receive clock signal CLK0 and input signals S10a. In response to a specified state transition of clock signal CLK0 (e.g. a rising or falling edge), first latches 110a latch the data values on input signals S10a onto output signals S20a. First latches 110a may be implemented using flip-flops (e.g. as shown in FIG. 6) and/or other sequential logic devices.

Transmitter 100 also includes a set of second latches 110b that receive clock signal CLK0 and input data signals S10b. Upon the specified state transition of clock signal CLK0, second latches 110b latch the data values on input signals S10b onto the inputs of delay elements 120. Second latches 110b may be implemented using flip-flops and/or other sequential logic devices. After a predetermined delay (which may be the same for all delay elements 120 or may differ among them), delay elements 120 impose the data values onto the respective output signals S20b.

Transmitter 100 produces output signals S20 for transmission across a set of conductive paths (e.g. as shown in FIGS. 1, 3, and 5), the output signals S20 being arranged such that adjacent conductive paths that carry outputs signals S20b are separated by at least one conductive path that carries an output signal S20a. In an exemplary application, no two output signals 20a are carried over adjacent conductive paths and no two output signals 20b are carried over adjacent conductive paths. Because transitions on the signals S20b are delayed with respect to those on the signals S20a, it may be understood that data transitions on adjacent conductors are separated in time.

Figure 7:
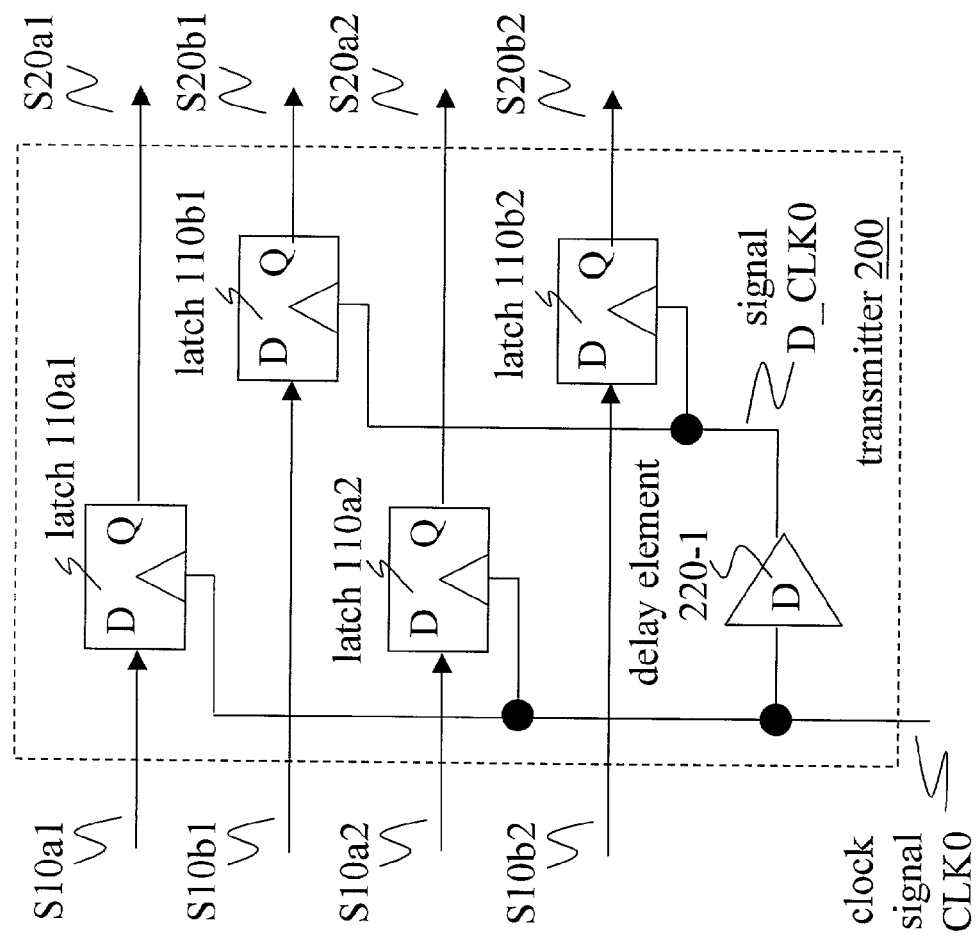
FIG. 7 is a block diagram of an implementation 200 of a transmitter 10 according to an embodiment of the invention.

It may be desirable to perform the time separation among the output signals S20 by inserting one or more delay elements into a clock path rather than (or in addition to) inserting delay elements into one or more signal paths. FIG. 7 shows a block diagram of an alternative implementation 200 of a transmitter 100 according to an embodiment of the invention. Transmitter 200 includes a set of first latches 110a that receive a clock signal CLK0 and input data signals S10a. As above, in response to a specified state transition of clock signal CLK0 (e.g. a rising or falling edge), first latches 110a latch the data values on input signals S10a onto output signals S20a.

Transmitter 200 includes a delay element 220-1, which receives clock signal CLK0 and produces a clock signal D_CLK0 having a predetermined delay with respect to clock signal CLK0. Transmitter 200 also includes a set of second latches 110b that receive input data signals S10b and delayed clock signal D_CLK0. In response to a specified state transition of delayed clock signal D_CLK0, second latches 110b latch the data values on input signals S10b onto output signals S20b. In one implementation, delay element 220-1 introduces a predetermined delay that is variable (e.g. according to a control signal from a control unit).

In a transmitter according to implementation 100, it may be desirable for the delays introduced by delay elements 120 to have values at least twice the rise time of clock signal CLK0 and no greater than one-half of the period of clock signal CLK0. In a transmitter according to implementation 200, it may be desirable for delayed clock signal D_CLK to be delayed with respect to clock signal CLK0 by a value that is at least twice the rise time of clock signal CLK0 and no greater than one-half of the period of clock signal CLK0. Particular delay values may be selected for specific applications (e.g. based on simulations) to minimize interaction among transitions on the conductive paths.

As compared to transmitter 100, transmitter 200 may be constructed using fewer delay elements (in these particular examples, one delay element as compared to N/2 delay elements, where N is the total number of signal lines S10). Transmitter 200 may also exhibit a more uniform power consumption over time, as no more than half of the latches in transmitter 200 switch at any given time (for an application in which the number of output signals S20a equals the number of output signals S20b). Additionally, for transmitter 200 as shown in FIG. 7, the number of conductive paths is not a factor in the number of delays: regardless of the number of conductors, one delay is sufficient to achieve a separation in time of data transitions on adjacent conductors. This feature may support a longer life expectancy of transmitter 200 and/or of an integrated circuit that includes transmitter 200.

Figure 8:
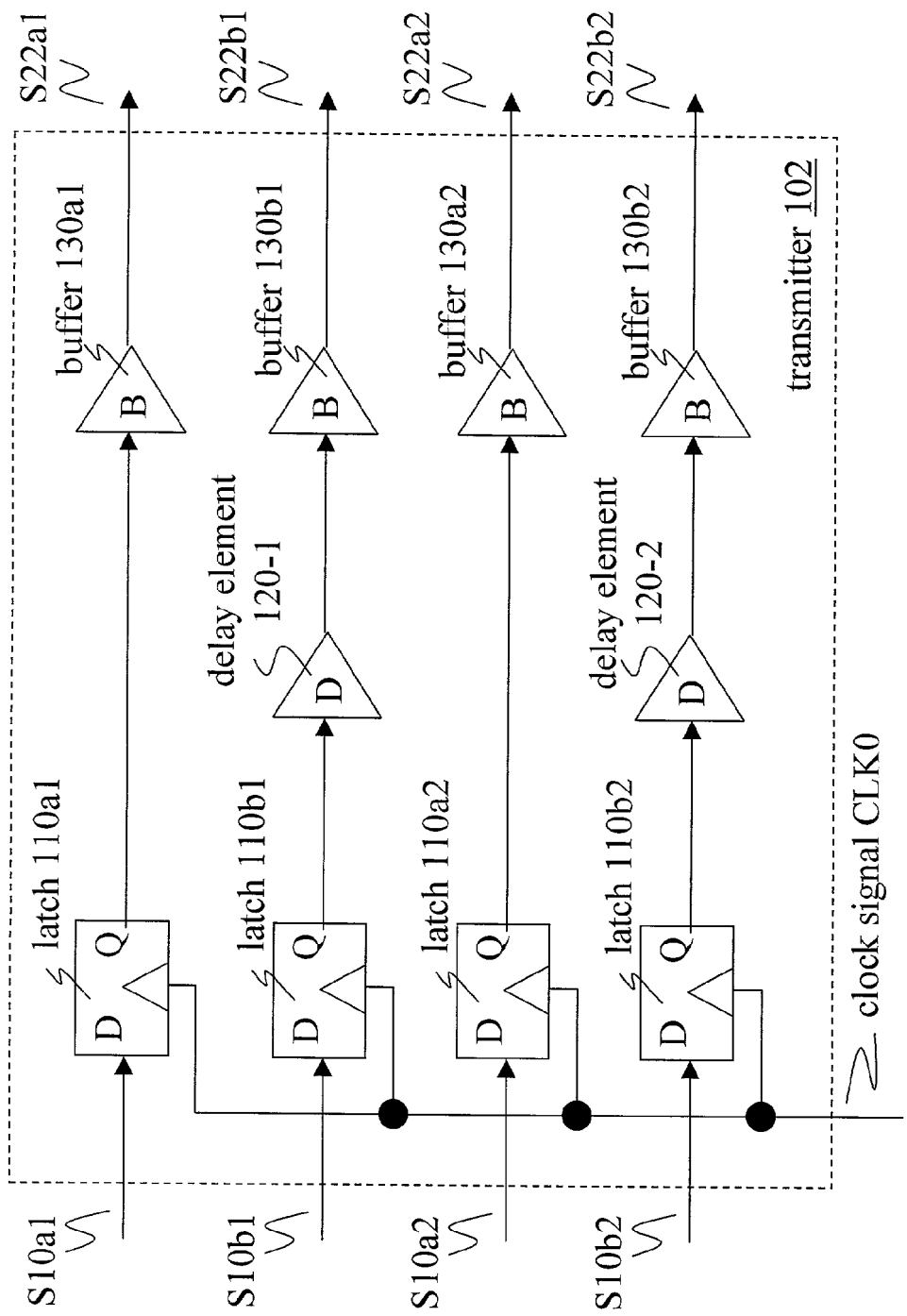
FIG. 8 is a block diagram of an implementation 102 of a transmitter 10 according to an embodiment of the invention.
Figure 9:
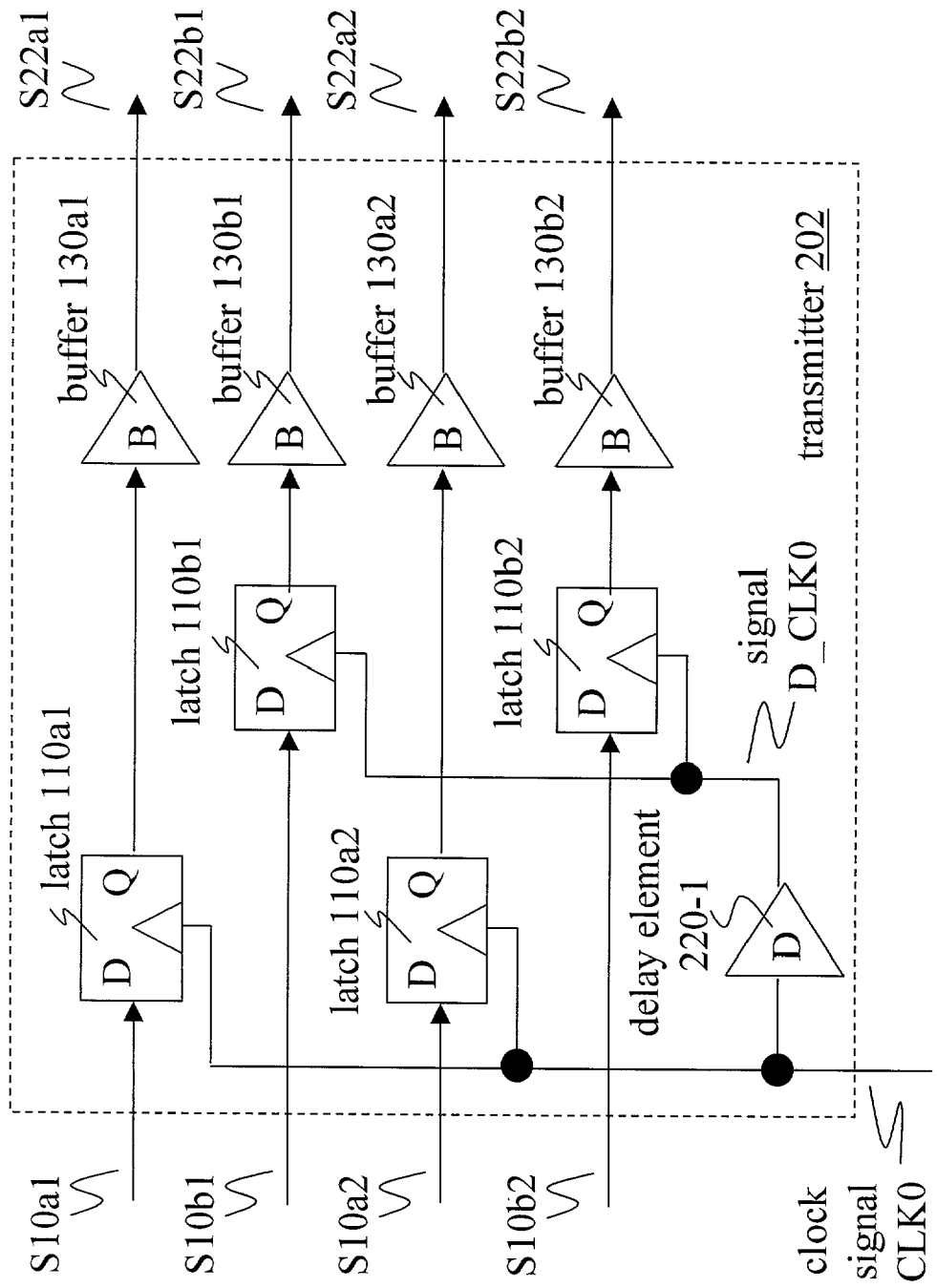
FIG. 9 is a block diagram of an implementation 202 of a transmitter 10 according to an embodiment of the invention.

In some applications, it may be desirable to pass one or more of the output signals S20 through a buffer prior to transmission on the conductive paths (e.g. transmission lines). For example, a buffer 130 may be used to boost the signal to an acceptable level for the intended receiver or to reduce the impact of a capacitive load (e.g. as may be encountered in a long transmission line). FIGS. 8 and 9 show implementations 102 and 202 of transmitters 100 and 200, respectively, that include buffers 130. In an exemplary implementation, a buffer 130 is implemented as two consecutive inverters, with the second inverter outputting a stronger signal (e.g. having larger transistors) than the first inverter.

It may be desirable to increase the separation in space between data transitions that may interfere. For example, it may be desirable to increase the distance between conductive paths carrying similarly timed data transitions.

Figure 10:
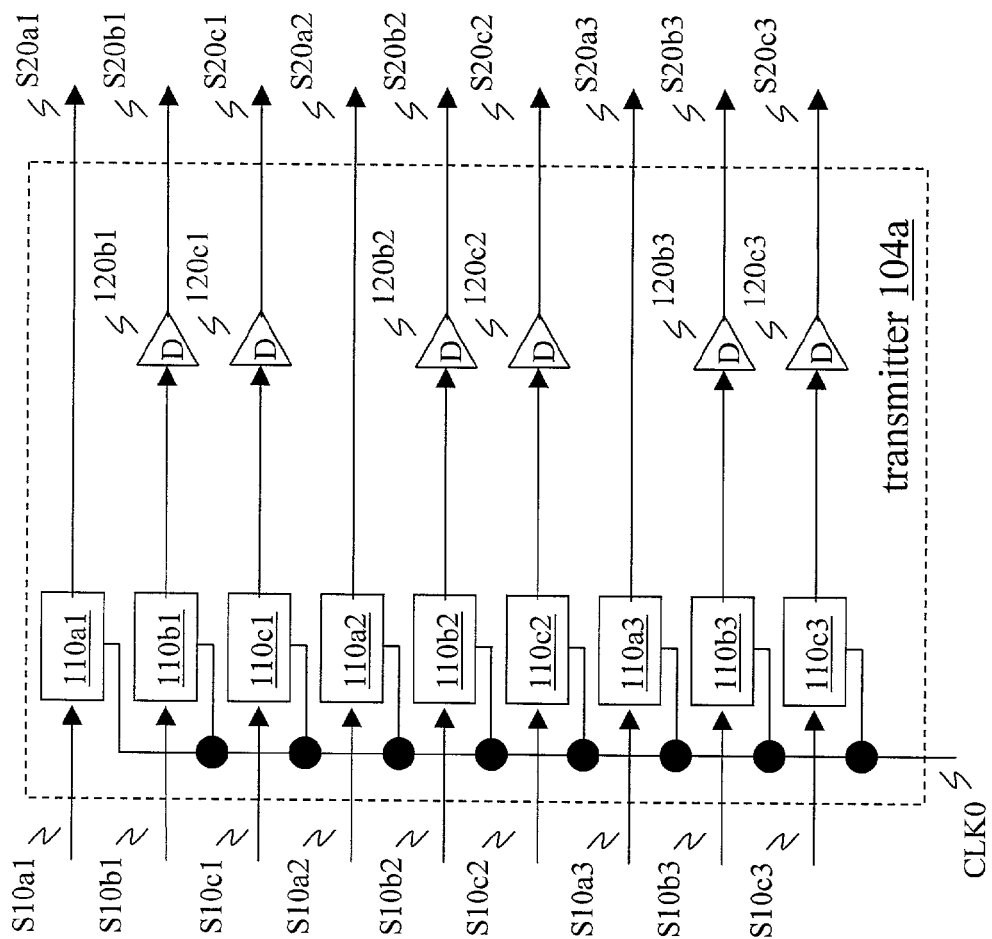
FIG. 10 is a block diagram of an implementation 104a of a transmitter 10 according to an embodiment of the invention.

FIG. 10 shows a block diagram of an implementation 104a of transmitter 10 according to an embodiment of the invention in which more than one other output signal S20 separates adjacent output signals S20 having the same clock dependence. In this example, output signals S20a are not delayed, output signals S20b are delayed (via delay elements 120b) by a first delay period, and output signals S20c are delayed (via delay elements 120c) by a second delay period that is longer than the first delay period. Further implementations may be configured to include output signals S20 having other delay periods, with the conductive paths being arranged to minimize signal interaction (e.g. in order of increasing delay periods as shown in FIG. 10). It may be desirable for the shortest delay period between adjacent conductors to have a value that is at least twice the rise time of clock signal CLK0 and for the longest delay period among the set of conductors to have a value that is no greater than one-half of the period of clock signal CLK0.

Figure 11:
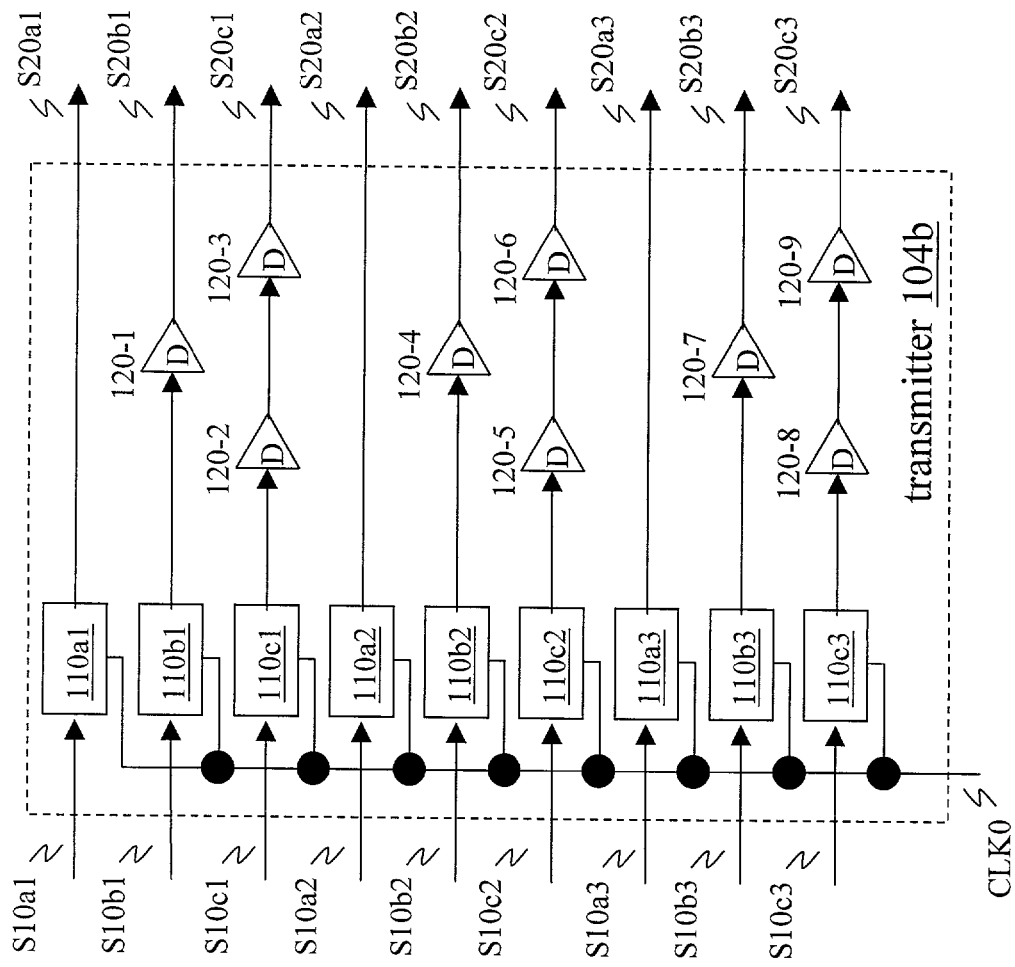
FIG. 11 is a block diagram of an implementation 104b of a transmitter 10 according to an embodiment of the invention.

FIG. 11 shows a block diagram of an alternative implementation 104b of a transmitter 104a as shown in FIG. 10. In this example, the delay elements 120 all have the same delay period, such that output signals S20c are delayed by twice the delay period of output signals S20b.

Figure 12:
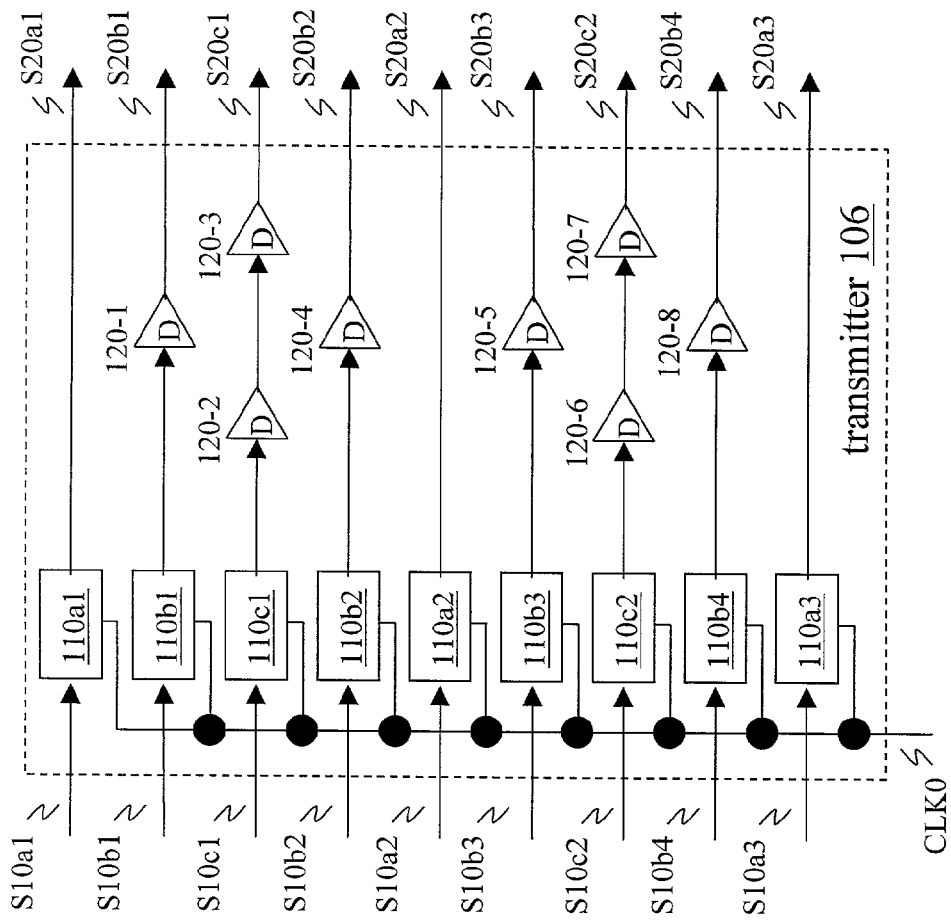
FIG. 12 is a block diagram of an implementation 106 of a transmitter 10 according to an embodiment of the invention.

In some cases, it may be desirable to have a uniform delay separation between the output signals on adjacent conductors. FIG. 12 shows a block diagram of an implementation 106 of transmitter 100 according to an embodiment of the invention that has a time separation of one delay unit between output signals S20 on adjacent conductors (in this example, delay elements 120 all have the same delay period).

Figure 13:
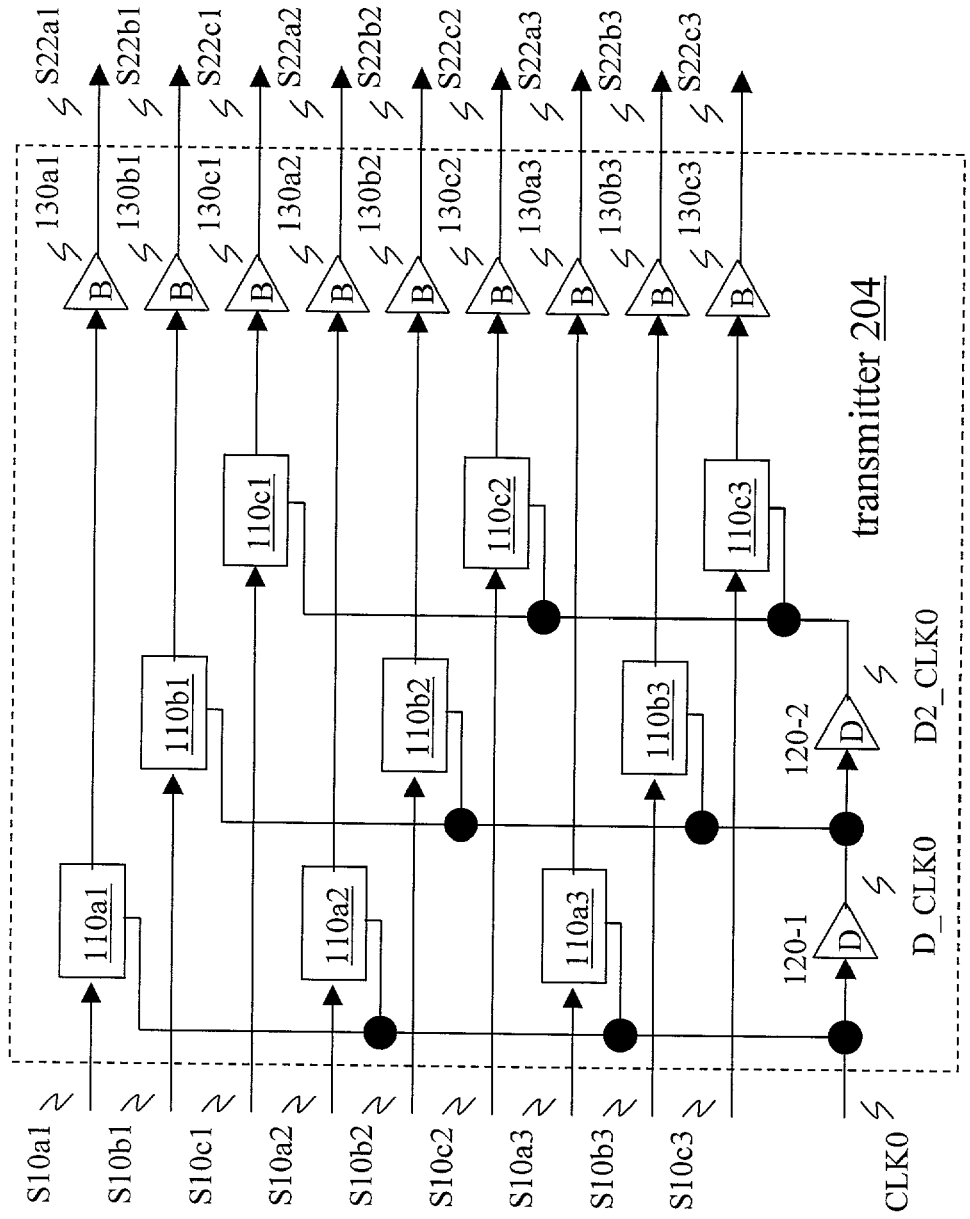
FIG. 13 is a block diagram of an implementation 204 of a transmitter 10 according to an embodiment of the invention.
Figure 14:
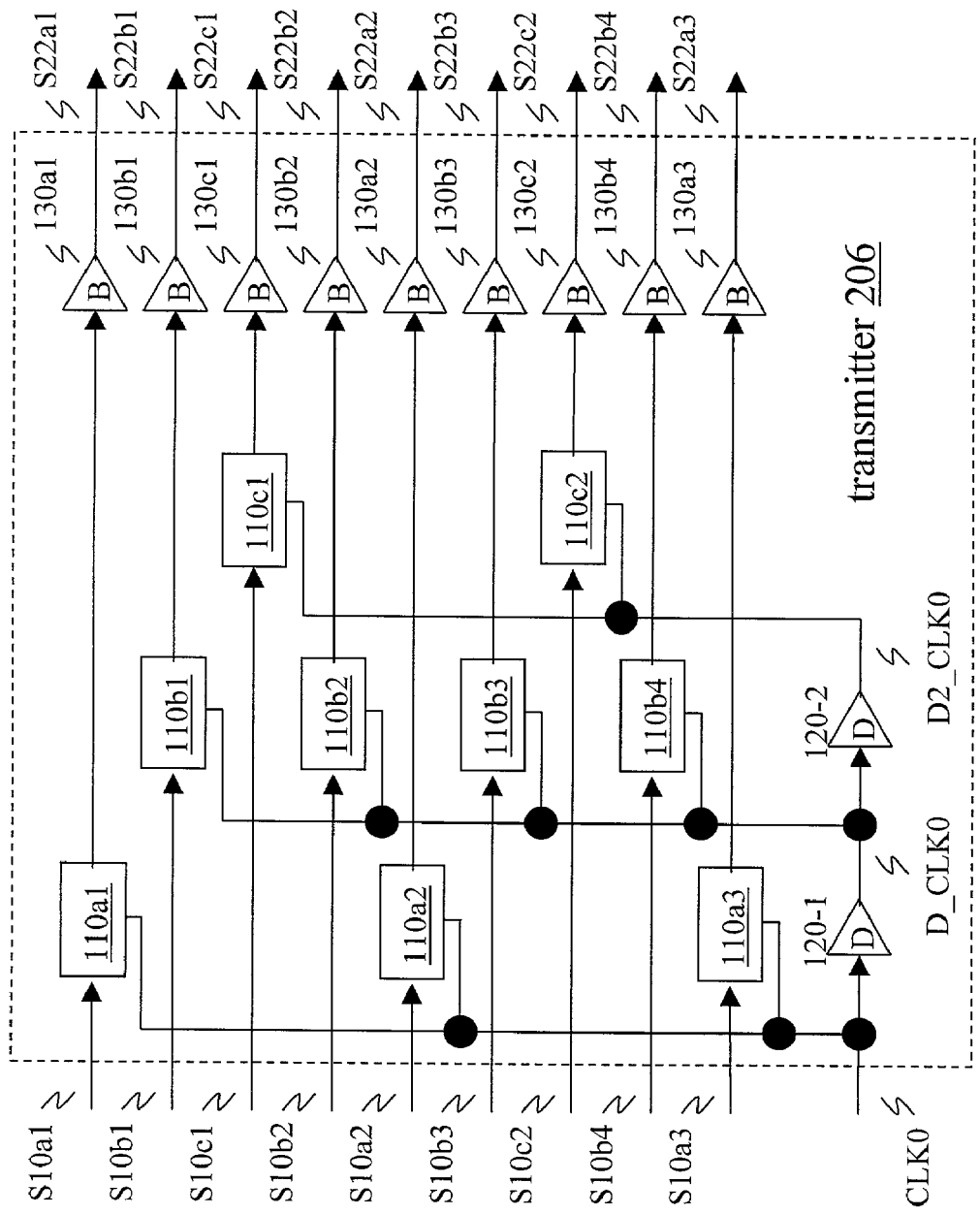
FIG. 14 is a block diagram of an implementation 206 of a transmitter 10 according to an embodiment of the invention.

FIG. 13 shows a block diagram of a transmitter 204 having multiple delayed clock signals D_CLK0, D2_CLK0 in which adjacent output signals S20 having the same clock dependence are separated by more than one other output signal S20. FIG. 14 shows a block diagram of a transmitter 206 having multiple delayed clock signals whose output signals S20 have mutual time relations that are similar to those of the output signals S20 of transmitter 106 as shown in FIG. 12.

One possible advantage of an implementation 204 of a transmitter as shown in FIG. 13 is that each delay element may be loaded evenly (or nearly evenly), while in an implementation 206 of a transmitter as shown in FIG. 14, an uneven delay element fanout may result. According to the particular application, buffers 130 as described above may optionally be used in implementations of transmitter 10 as shown in FIGS. 10–14.

Figure 15:
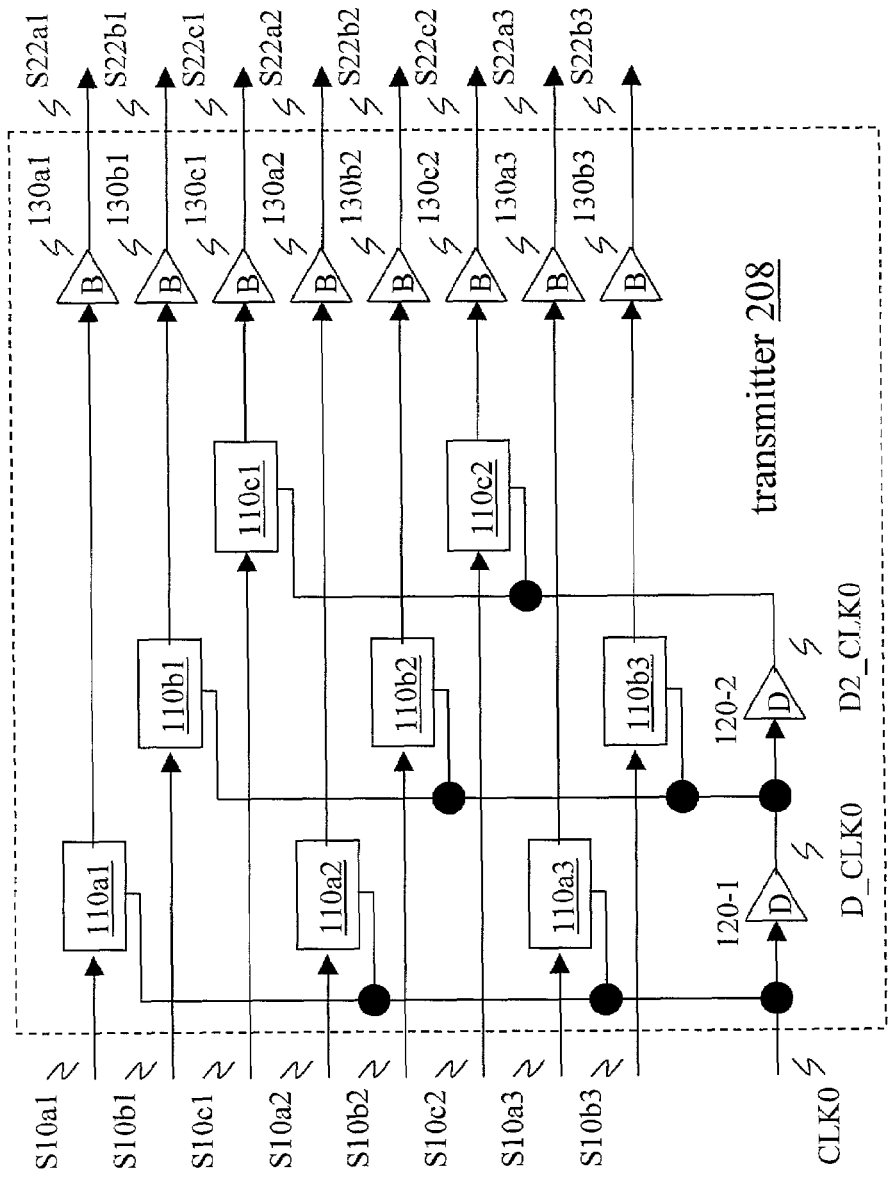
FIG. 15 is a block diagram of an implementation 208 of a transmitter 10 according to an embodiment of the invention.

It is possible but not necessary for the number of output signals S20 to be an integer multiple of the number of sets of latches in the transmitter. FIG. 15 shows an example in which an implementation 208 of transmitter 10 having three sets of latches is arranged to drive an eight-bit bus.

Figure 16:
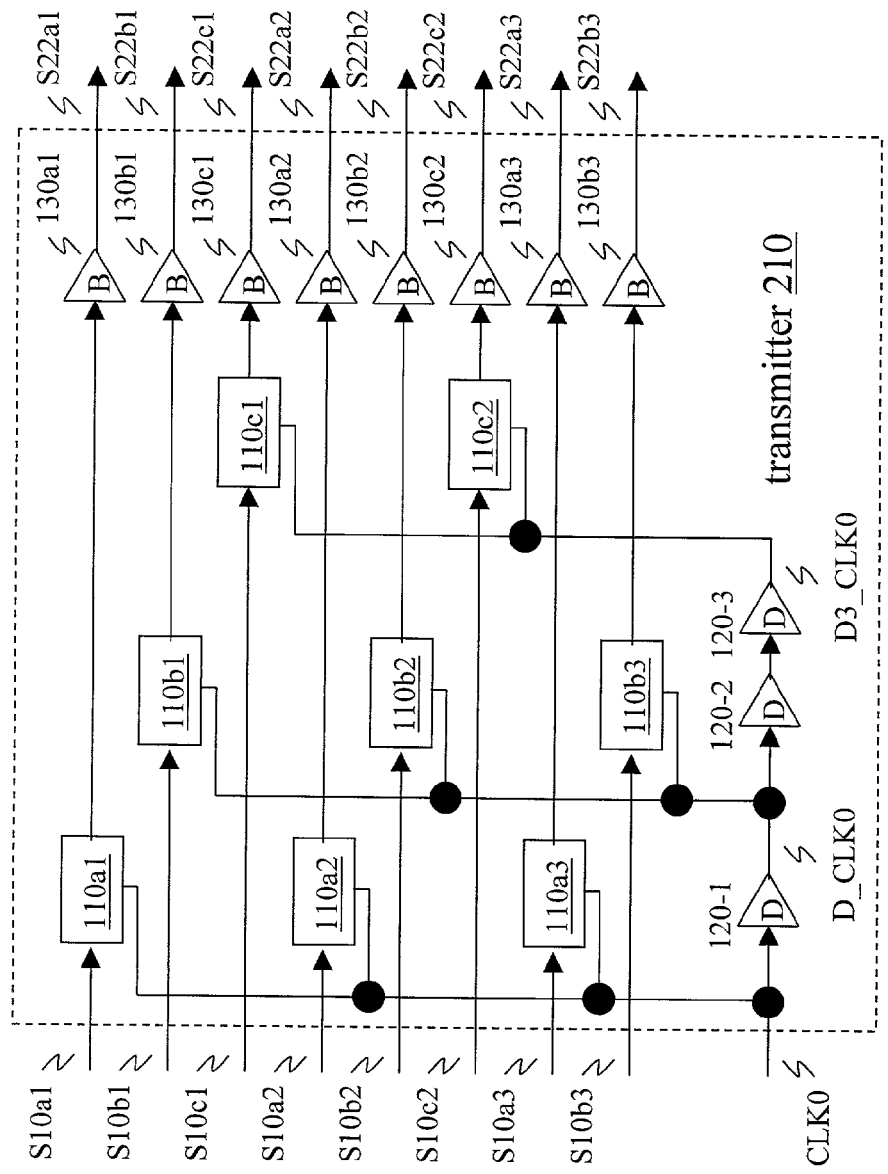
FIG. 16 is a block diagram of an implementation 210 of a transmitter 10 according to an embodiment of the invention.

Also, it is possible but not necessary for the delay elements to have equal delay periods, or for the delays between sets of latches to be equal. FIG. 16 shows an example in which a unit delay separates the clock signals CLK0 and D_CLK0 driving latches 110a and 110b, respectively, while a two-unit delay separates the clock signals D_CLK0 and D3_CLK0 driving latches 110b and 110c, respectively. Other delay distributions may be implemented according to the particular application (e.g. as indicated by simulations). Also, buffers 130 as shown in FIGS. 15 and 16 may be optionally used according to the particular application.

Figure 17:
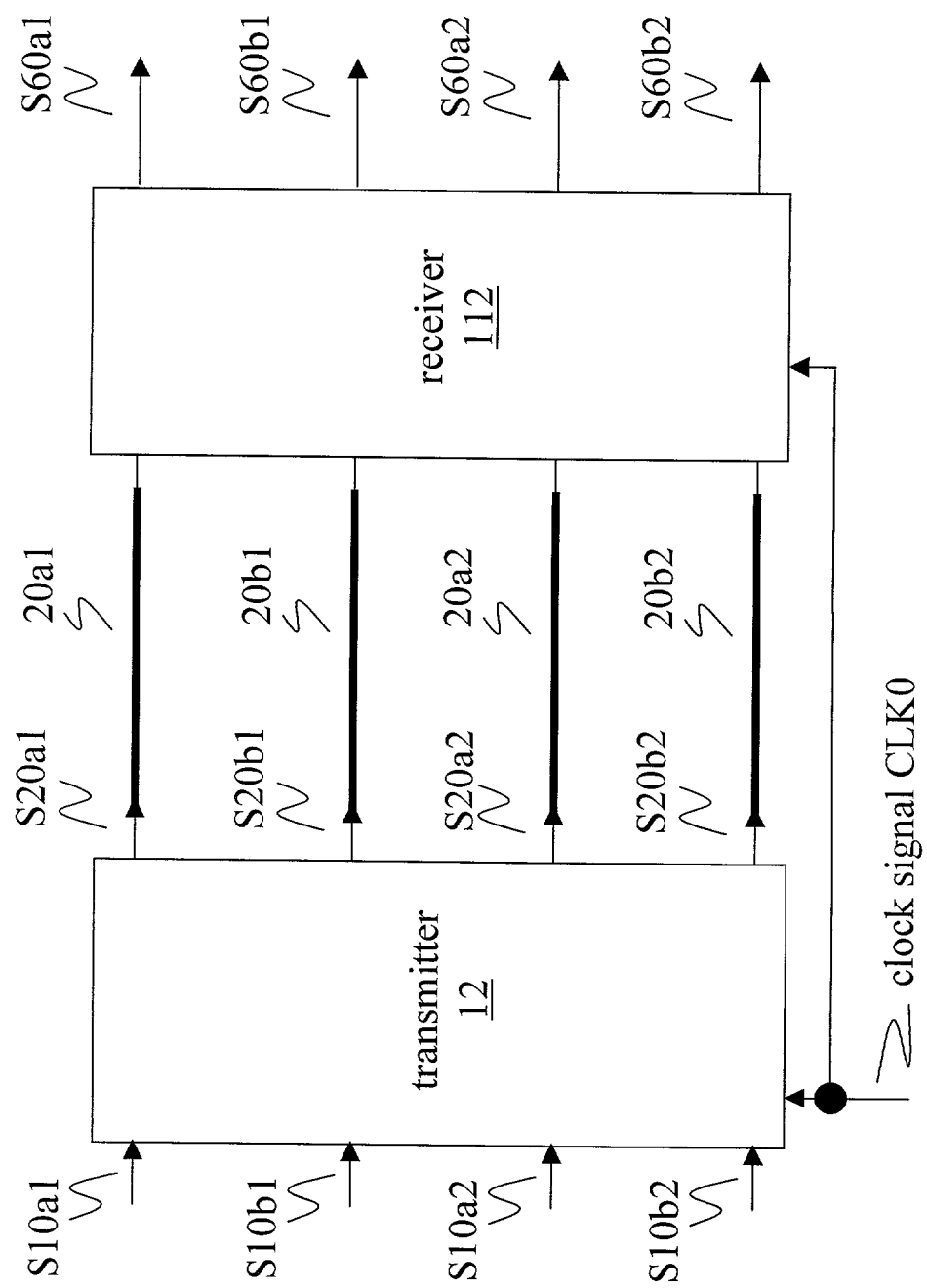
FIG. 17 is a block diagram showing an application of a transmitter 10 and a receiver 112 according to an embodiment of the invention.

FIG. 17 illustrates an application according to an embodiment of the invention that includes a transmitter 12 and transmission lines 20 as described above. This application also includes a receiver 112 configured to receive output signals S20 and clock signal CLK0 and to produce received signals S60. Depending on factors such as a time relation between clock signal transitions at the transmitter and clock signal transitions at the receiver, the length of the delay between corresponding transitions on output signals S20a and S20b, and a desired relation between transitions on received signals S60, the implementation of receiver 112 may vary according to the particular application. In an exemplary application, state transitions on signals S60 are similarly timed with respect to each other.

Figure 18:
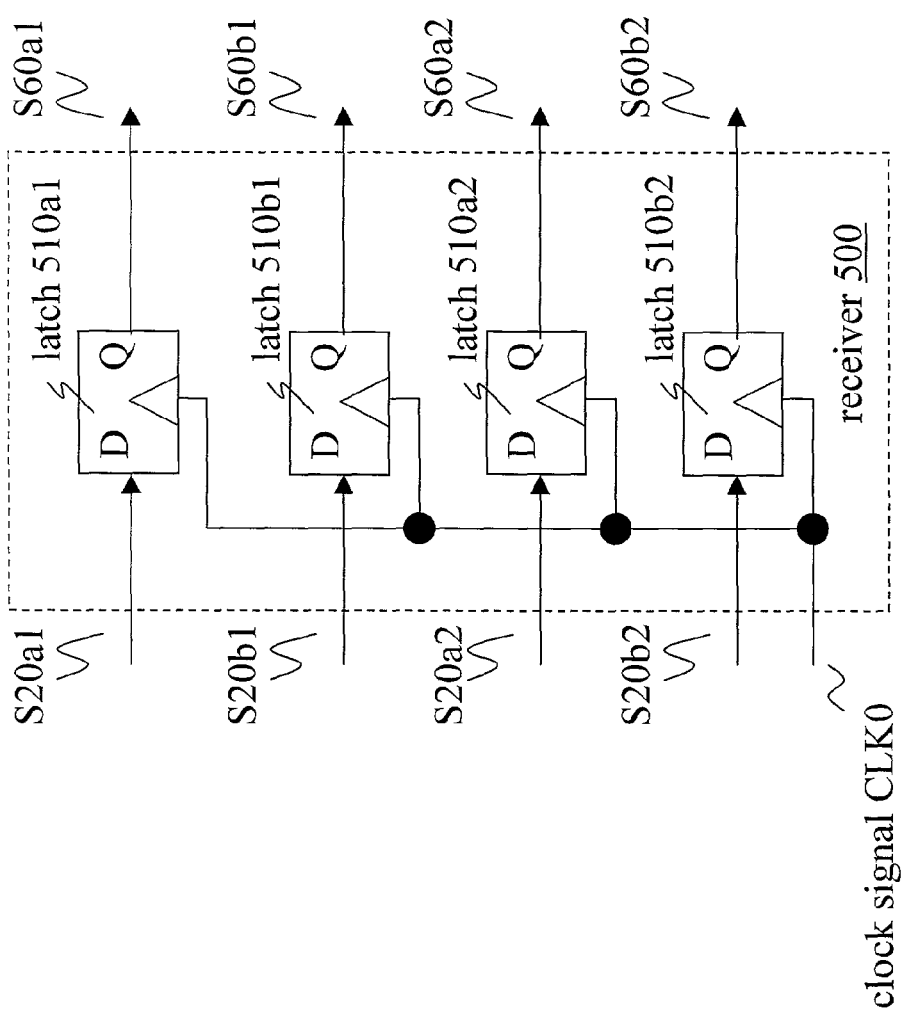
FIG. 18 is a block diagram of an implementation 500 of a receiver 112 according to an embodiment of the invention.
Figure 19:
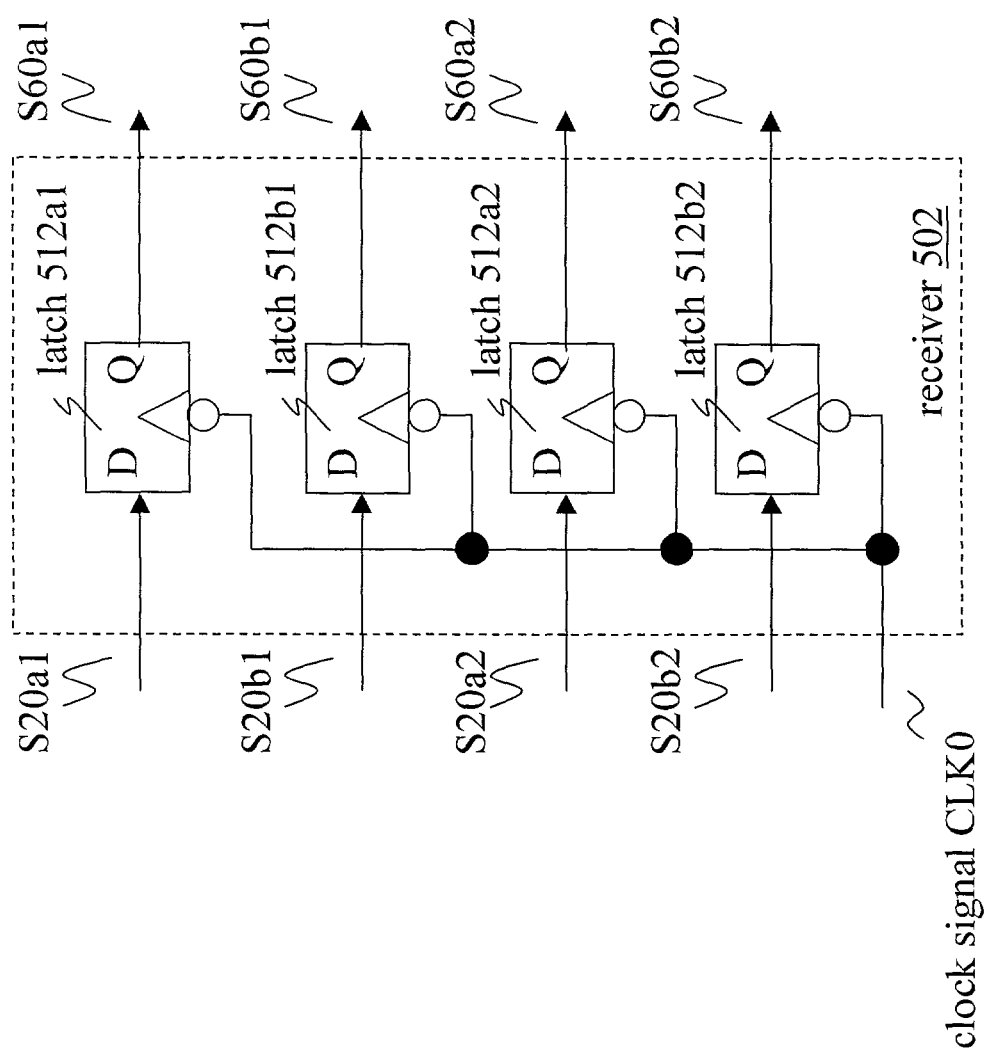
FIG. 19 is a block diagram of an implementation 502 of a receiver 112 according to an embodiment of the invention.

As a consequence of a delay (whether inherent or deliberate) in transmitting a clock signal to receiver 112 (e.g. over one of the transmission lines), it may be possible to use a signal based on clock signal CLK0 to control the operation of latches 510 at the receiver. FIG. 18 shows an implementation 500 of receiver 112 according to such an embodiment of the invention. FIG. 19 shows an alternate implementation 502 in which latches 512b are configured to latch upon the other transition of the clock signal.

Figure 20:
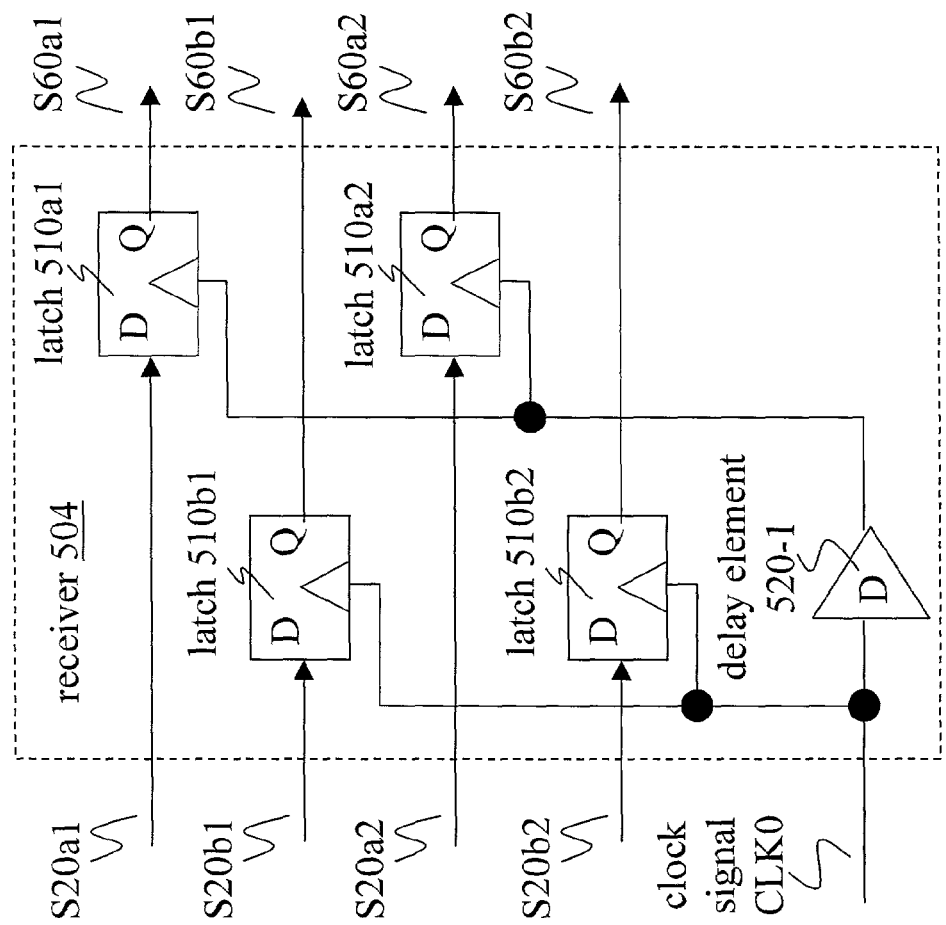
FIG. 20 is a block diagram of an implementation 504 of a receiver 112 according to an embodiment of the invention.

FIG. 20 shows an implementation 504 of receiver 112 according to another embodiment of the invention. In this implementation, a clock signal supplied to latches 510a is delayed by delay element 520-1 with respect to a clock signal CLK0 as supplied to latches 510b. In a case where output signals 20b are transmitted having a delay with respect to signals 20a (e.g. as described above), a net effect may be achieved in which receiver output signals S60a and S60b are essentially synchronous, have essentially the same time relation as they did before entering the transmitter, and/or have some other desired time relation.

Figure 21:
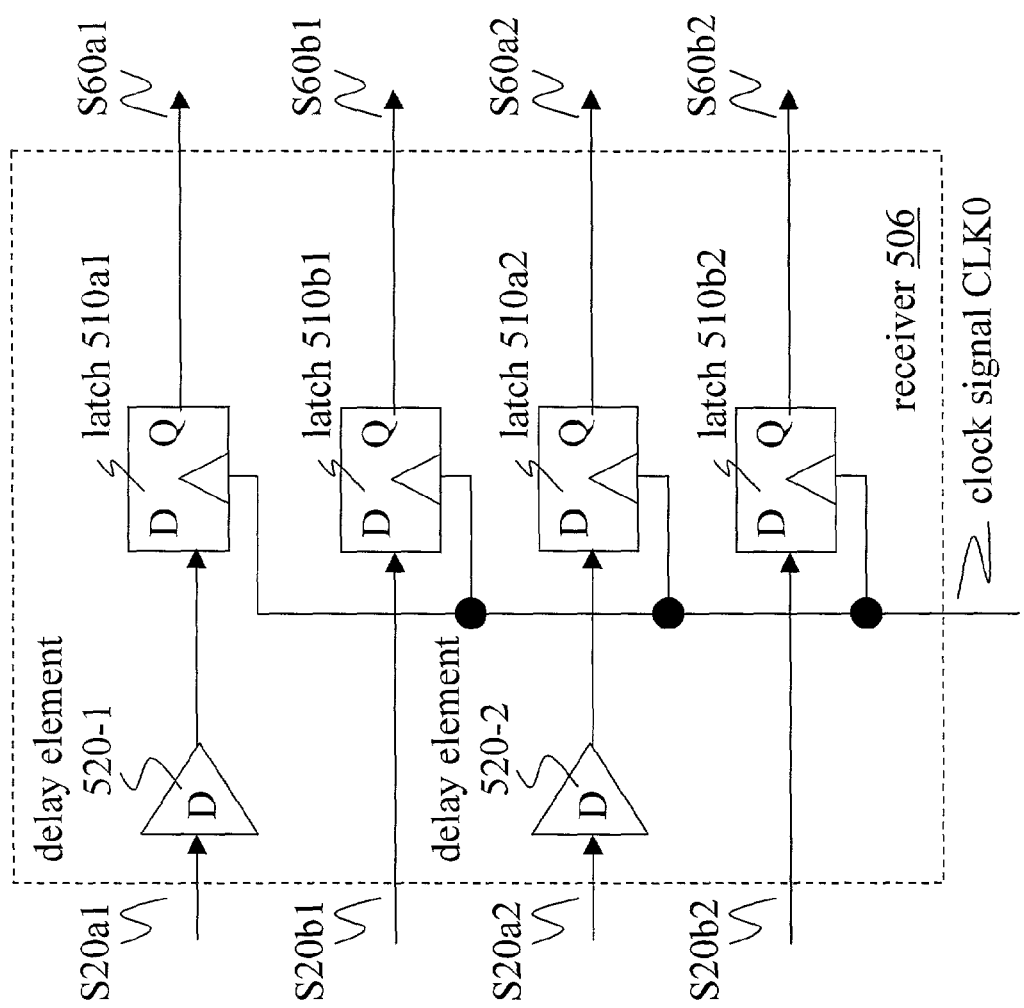
FIG. 21 is a block diagram of an implementation 506 of a receiver 112 according to an embodiment of the invention.

It may be advantageous to delay the data signals at the receiver instead of delaying the clock signal, as clock delays may complicate downstream synchronous logic operations. FIG. 21 shows an implementation 506 of receiver 112 according to an embodiment of the invention in which signals S20a are delayed by delay elements 520 before being inputted to latches 510a. As in the example of FIG. 20, in a case where signals 20b are transmitted having a delay with respect to signals 20a, a net effect may be achieved in which receiver output signals S60a and S60b are essentially synchronous, have essentially the same time relation as they did before entering the transmitter, and/or have some other desired time relation.

A scheme of delaying a clock signal in the transmitter may be combined with a scheme of delaying alternating latch inputs in the receiver, and vice versa, and either such scheme may also be used in combination with a scheme of using rising and falling edges to control latches in the transmitter or receiver. Receivers as illustrated in FIGS. 18–21 may also be used with other implementations of transmitter 10 as described herein.

In a method for reducing interaction between signals on nearby conductors according to a further embodiment of the invention, signals on adjacent conductive paths pass through different alternating sequences of inversions and regenerations.

Figure 22:
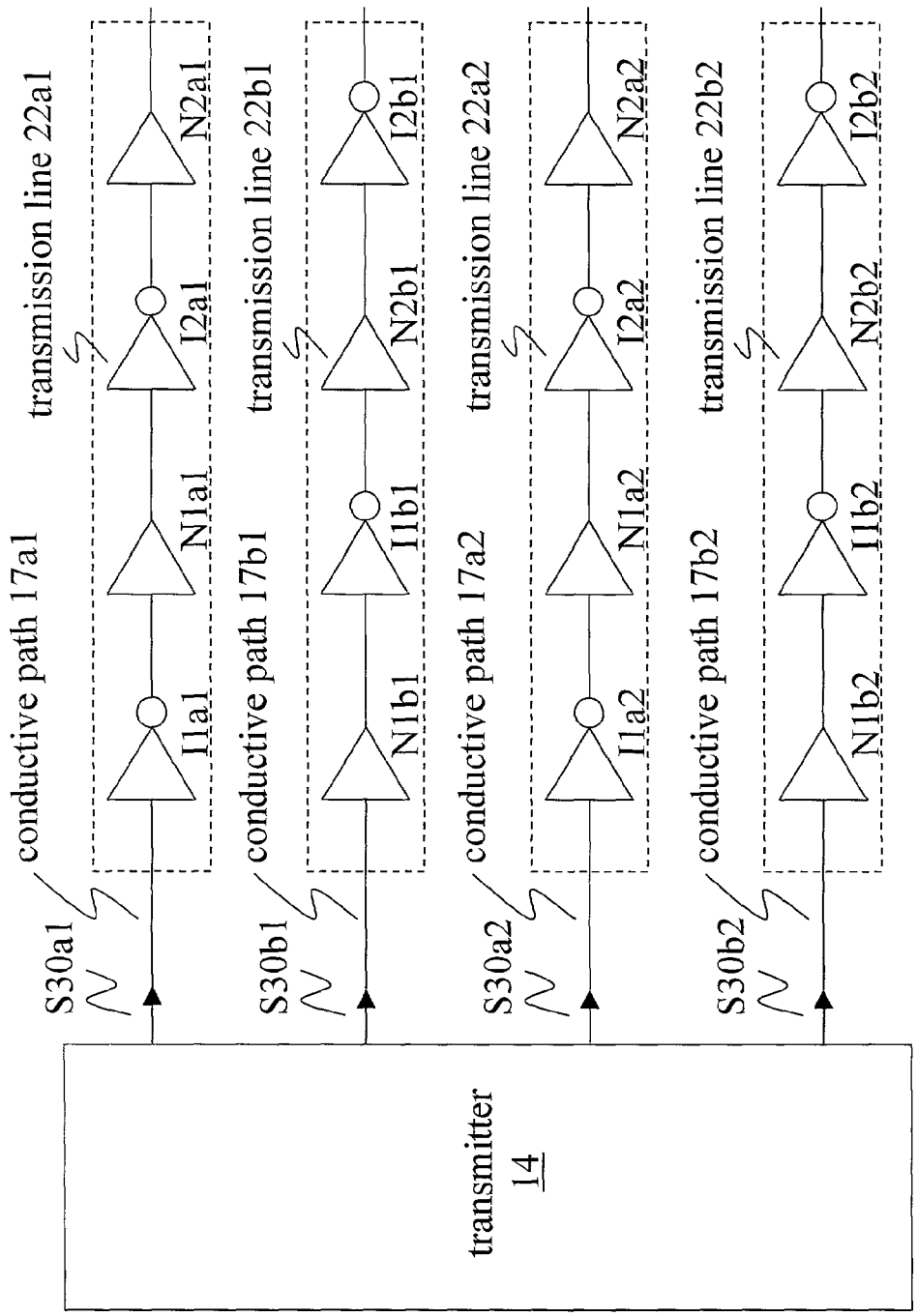
FIG. 22 is a block diagram showing an application of a transmitter 14 according to an embodiment of the invention.

FIG. 22 shows a block diagram of a system for data transmission according to an embodiment of the invention. Transmitter 10 produces a first set of output signals S30a and a second set of output signals S30b. A first set of conductive paths 17a receives the first set of output signals S30a, and a second set of conductive paths 17b receives the second set of output signals S30b. In an exemplary implementation, conductive paths 17 are parallel to one another.

Each of the conductive paths 17 includes a transmission line 22 that has a series of inverting buffers I and non-inverting buffers N. Inverting buffers I invert the state transitions of the signals they pass, and non-inverting buffers N regenerate the state transitions of the signals they pass. In the system shown in FIG. 22, each of the transmission lines 22 has an alternating series of buffers, and the sequence of inversions and regenerations in the series of transmission lines 22a is different from (specifically, opposite to) the sequence in the series of transmission lines 22b.

When the same state transition occurs on two adjacent parallel conductors at substantially the same time (e.g. two rising edges), each transition tends to speed the propagation of the other along its respective transmission line. When opposite state transitions occur on two adjacent parallel conductors at substantially the same time (e.g. a rising and a falling edge), each transition tends to slow the propagation of the other along its respective transmission line.

In a typical application, the relations between transitions on adjacent transmission lines are not known a priori. For example, the data values being transmitted typically are not known beforehand. As the result, the slowing or speeding of propagation of a particular transition due to nearby transitions becomes unpredictable, and an undesirable timing uncertainty may result.

In a system having an alternating and opposite arrangement of inversions and regenerations as shown in FIG. 22, a transition passing from one end of a transmission line to the other will see the same (or nearly the same) number of similar state transitions and opposite state transitions on an adjacent transmission line. As described below, the system may be designed such that this condition is largely independent of the relation of the state transitions originally driven onto adjacent transmission lines 22, as is now described.

Figure 23A:
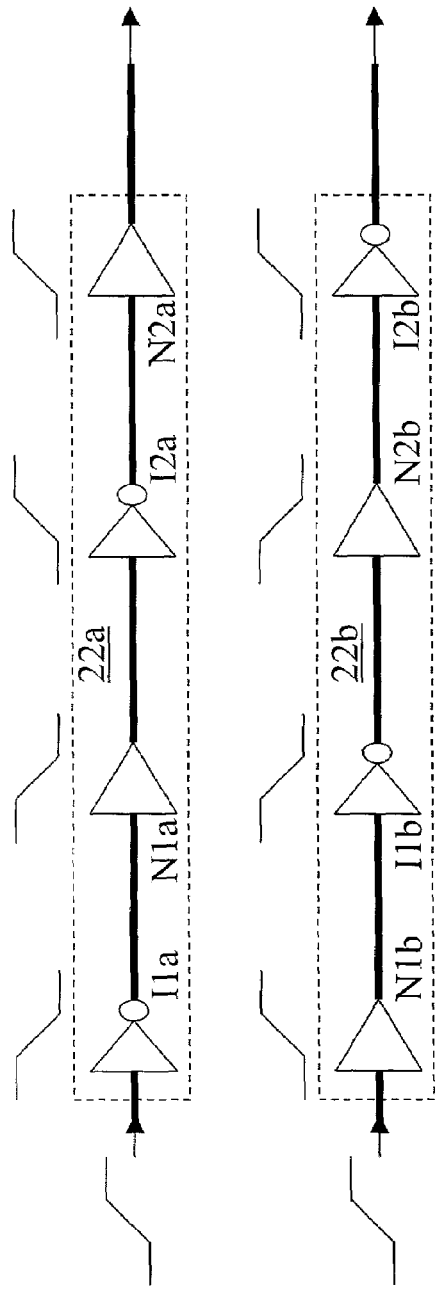
FIGS. 23A, 23B are illustrations showing transitions of signals transmitted on transmission lines that have opposite series of inverting and non-inverting buffers.
Figure 23B:
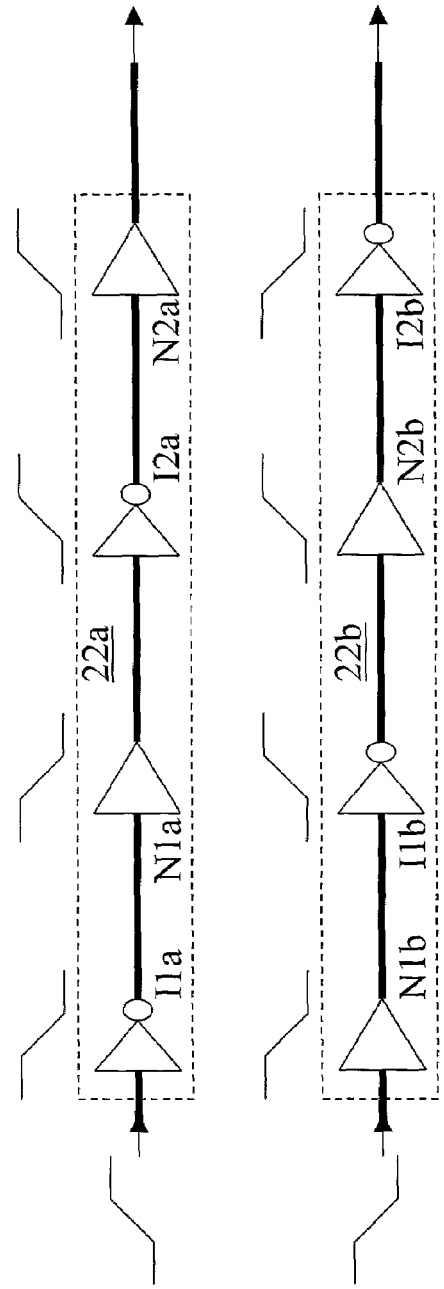

FIG. 23A shows an example in which a similar state transition is transmitted over two nearby transmission lines 22a and 22b, and FIG. 23B shows an example in which opposite state transitions are transmitted onto the two transmission lines. In the example of FIG. 23A, transmitting a rising state transition over transmission lines 22a, 22b causes the following pairs of propagating transitions to appear on the segments of the two transmission lines (from left to right) after each of the four buffers:

falling/rising, falling/falling, rising/falling, rising/rising.

In the example of FIG. 23B, transmitting a rising state transition over transmission line 22a and a falling state transition over transmission line 22b causes the following pairs of propagating transitions to appear on the segments of the two transmission lines (from left to right) after each of the four buffers:

falling/falling, falling/rising, rising/rising, rising/falling.

Although the pairs of propagating transitions appear in a different order in each case, one may see that in both cases, each of the four possible combinations occur once and only once. One may also see that the same is true for the other two possible input combinations (namely, a falling transition over both lines, and falling and rising transitions on lines 22a and 22b, respectively). Therefore, each transition transmitted along one of these transmission lines will see the same combination of transitions on the other line, regardless of whether the transitions are rising or falling, or similar or different.

In an application where each transition along transmission lines 22 has the same magnitude, one may expect the effect of each transition along a transmission line to be substantially constant (i.e. with respect to transitions on nearby transmission lines). Therefore, it may be desirable to configure buffers I, N such that each buffer receives a transition of substantially equal magnitude. In implementing a system as shown in FIG. 22, for example, it may be desirable for opposing buffers in adjacent transmission lines 22a, 22b (e.g. the pair of buffers I1a1 and N1b1) to be located at the same distance from transmitter 10.

It may also be desirable for each buffer to produce a transition of substantially equal magnitude. It may also be desirable to place the buffers of each transmission line such that each buffer receives transitions having one uniform magnitude and produces transitions having another uniform magnitude. For example, it may be desirable to have a uniform separation between the buffers of each transmission line 22.

Figure 24:
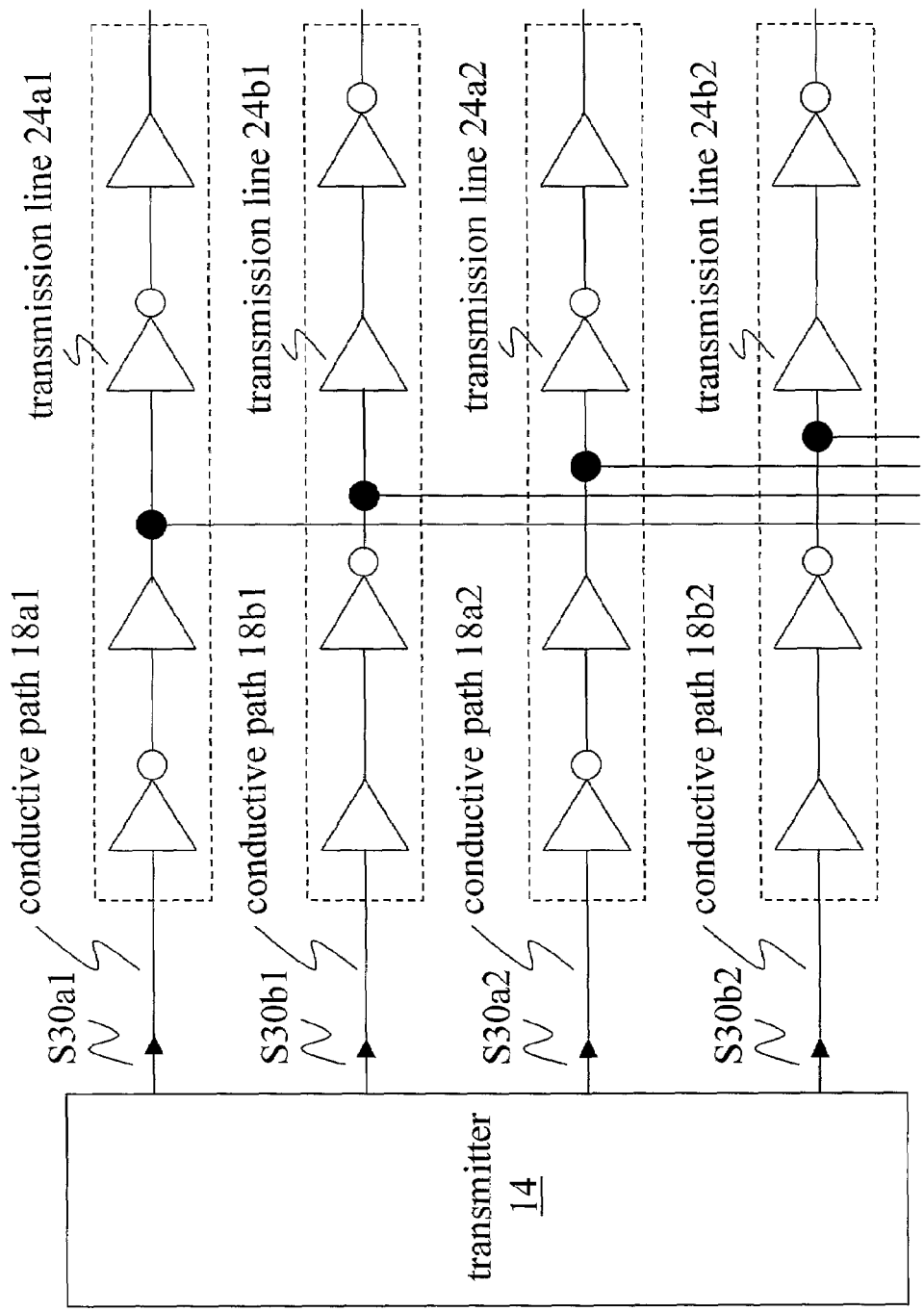
FIG. 24 is a block diagram showing an application of a transmitter 14 according to an embodiment of the invention.

As shown in FIG. 24, the signals carried by the parallel conductors may be used to drive one or more other sets of parallel conductors. A possible advantage of one such system is that a set of parallel conductors may be tapped off of the transmission lines in a short space, permitting transitions on the tapped conductors to have substantially equal magnitudes as well. For example, in an application characterized by a line pitch of 0.4 microns, an eight-bit bus may be tapped off over a length of less than four microns.

Figure 25:
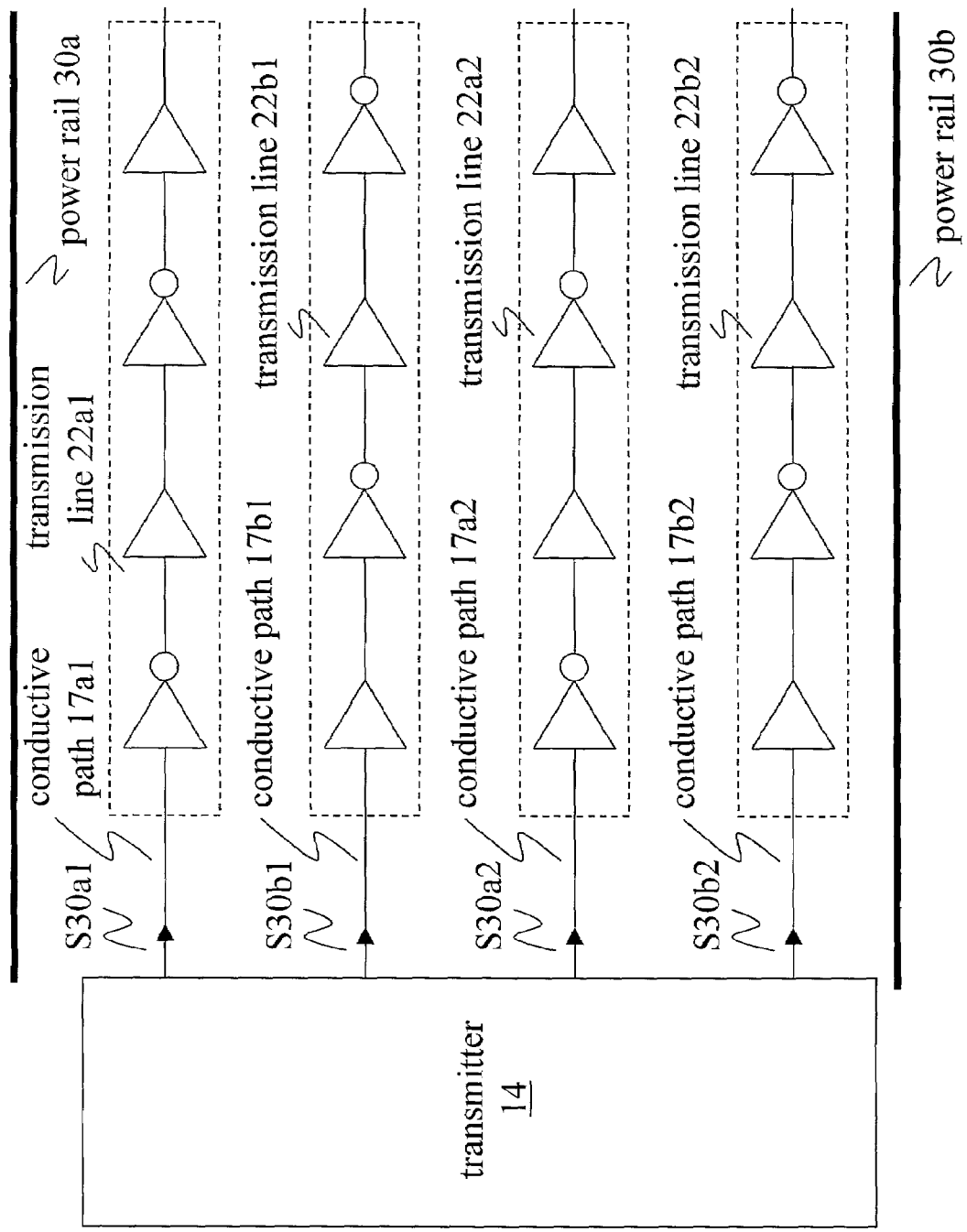
FIG. 25 is a block diagram showing an application of a transmitter 14 according to an embodiment of the invention.

FIG. 25 shows a block diagram of a system for data transmission according to an embodiment of the invention. In this example, a pair of power rails 30a, 30b are situated parallel to and on opposite sides of the set of conductive paths 17a, 17b (here, including transmission lines 22). Power rails 30a, 30b may be coupled to provide an operating voltage to transmitter 10 and/or one or more of the buffers of transmission lines 22, or these components may be powered from another source. In an exemplary implementation, power rails 30a, 30b (carrying respectively Vcc and ground potentials) reduce interference by providing a well-defined return path for the signals transmitted across conductive paths 17a, 17b. The arrangement of power rails 30a, 30b as shown in FIG. 25 may be used to similar effect in other embodiments described herein that include a plurality of conductive paths, such as those shown in FIGS. 1, 3, 5, 17, 22, and 29.

Data transitions having the same clock dependence may be further separated in space by combining a technique for separation in time between data transitions on adjacent conductors (e.g. as discussed above with reference to FIGS. 1–16) with a technique for passing signals on adjacent conductive paths through different alternating sequences of inversions and regenerations (e.g. as discussed above with reference to FIGS. 22–25).

Figure 26:
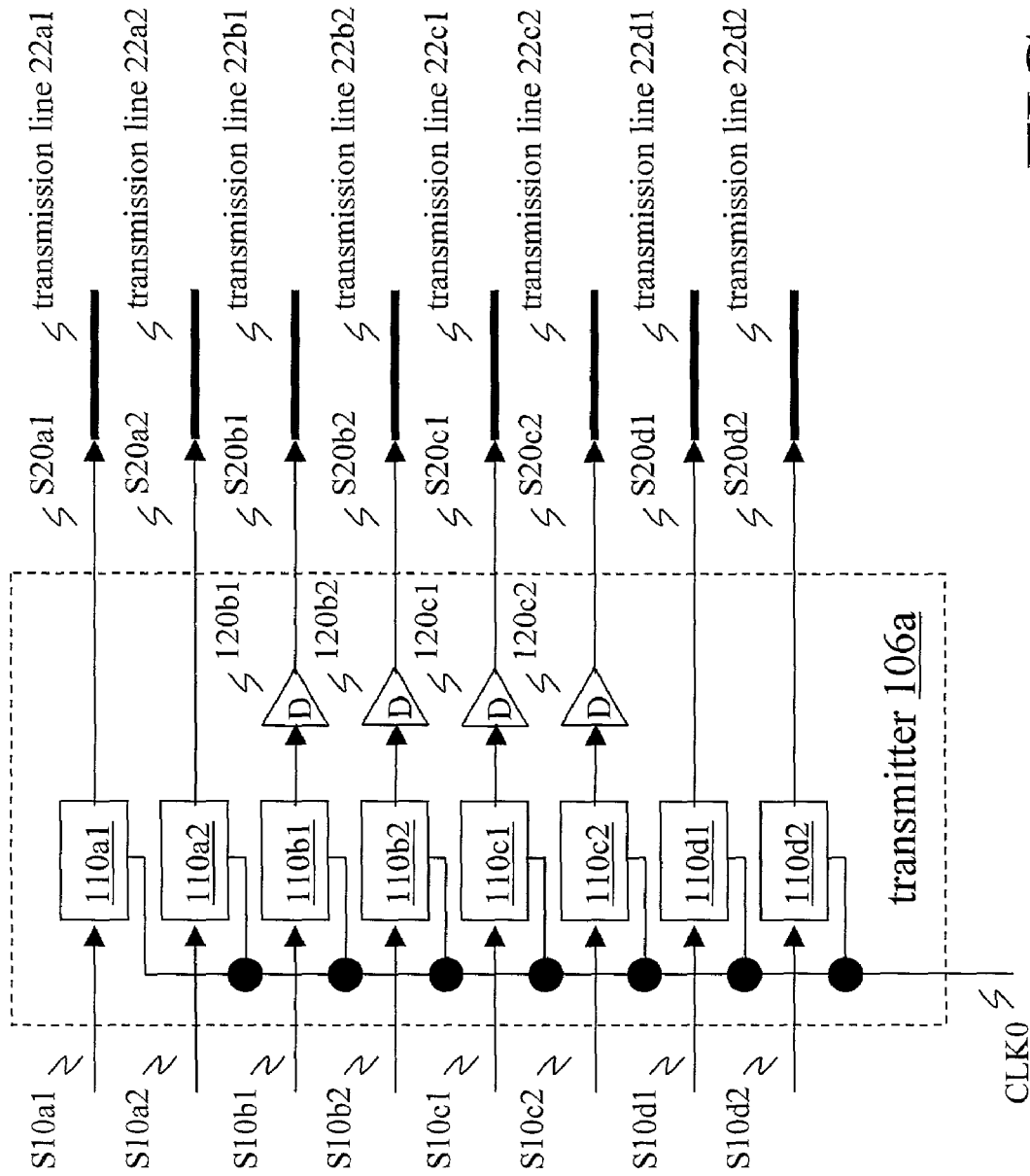
FIG. 26 is a block diagram showing an application of an implementation 106a of a transmitter 10 according to an embodiment of the invention.
Figure 27:
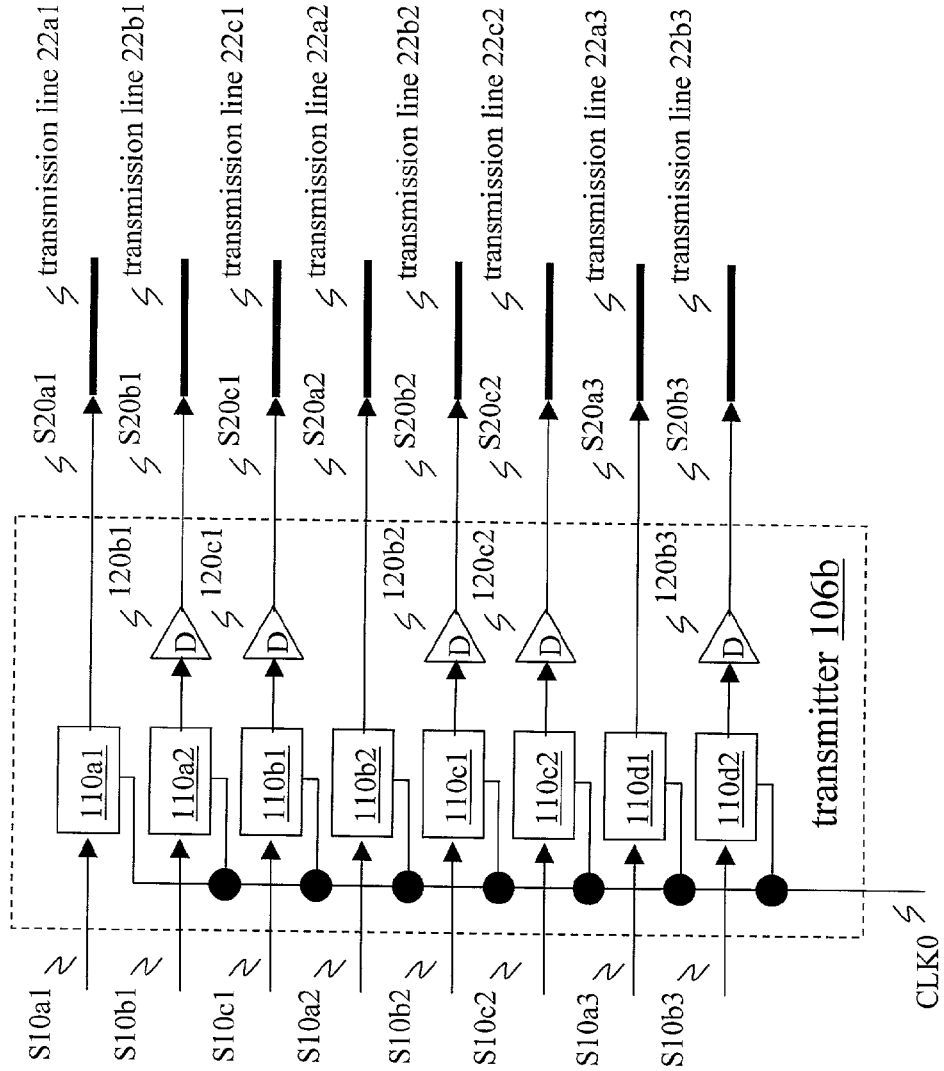
FIG. 27 is a block diagram showing an application of an implementation 106b of a transmitter 10 according to an embodiment of the invention.

To illustrate one such example, FIG. 26 shows a combination of an application of a method according to an embodiment of the invention as shown in FIG. 10 with an application of a method according to an embodiment of the invention as shown in FIG. 22, such that similarly timed signals transmitted on adjacent conductive paths pass through different alternating sequences of inversions and regenerations. FIG. 27 shows another such combination in which adjacent conductive paths carrying similarly timed signals include transmission lines having different alternating series of inverting and non-inverting buffers and are also separated by conductive paths carrying differently timed signals.

In a method for reducing interaction between signals on nearby conductors according to a further embodiment of the invention, data transitions having the same clock dependence are separated in space. In one such method, a first set of signals is transmitted in one direction on a first set of parallel conductors, and a second set of signals is transmitted in the opposite direction on a second set of parallel conductors that is interleaved with the first set.

Figure 28:
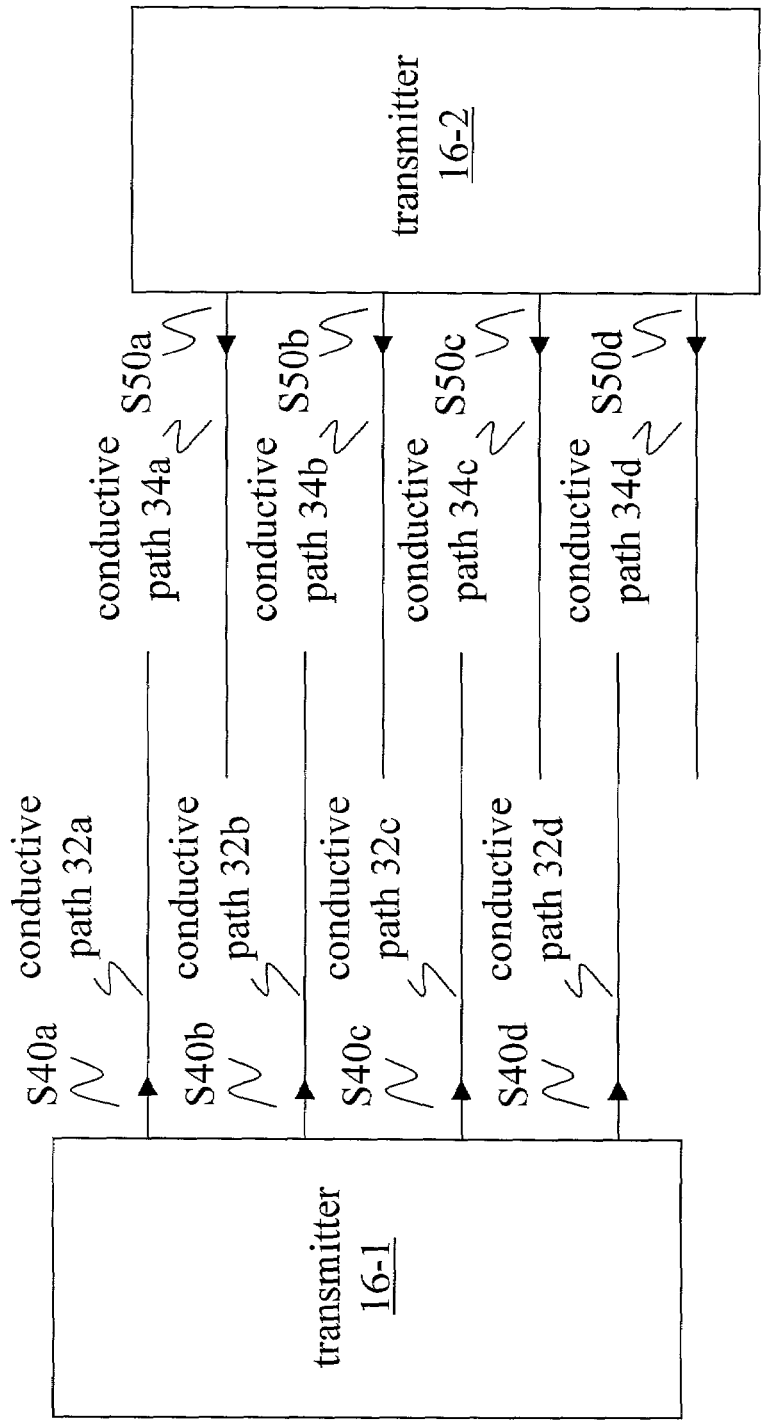
FIG. 28 is a block diagram showing an application of two instances 16-1 and 16-2 of an implementation 16 of a transmitter 10 according to an embodiment of the invention.

FIG. 28 shows a block diagram of an application of two instances 16-1, 16-2 of a transmitter according to an embodiment of the invention. In this application, transmitter 16 transmits output signals S40 on a set of conductive paths 32, and transmitter 16-2 transmits output signals S50 on a set of conductive paths 34. Conductive paths 32 and 34 are arranged such that adjacent conductors of one set are separated by at least one conductor of the other set. In an exemplary application, transmitter 16 is an implementation of transmitter 10 as described above.

Figure 29:
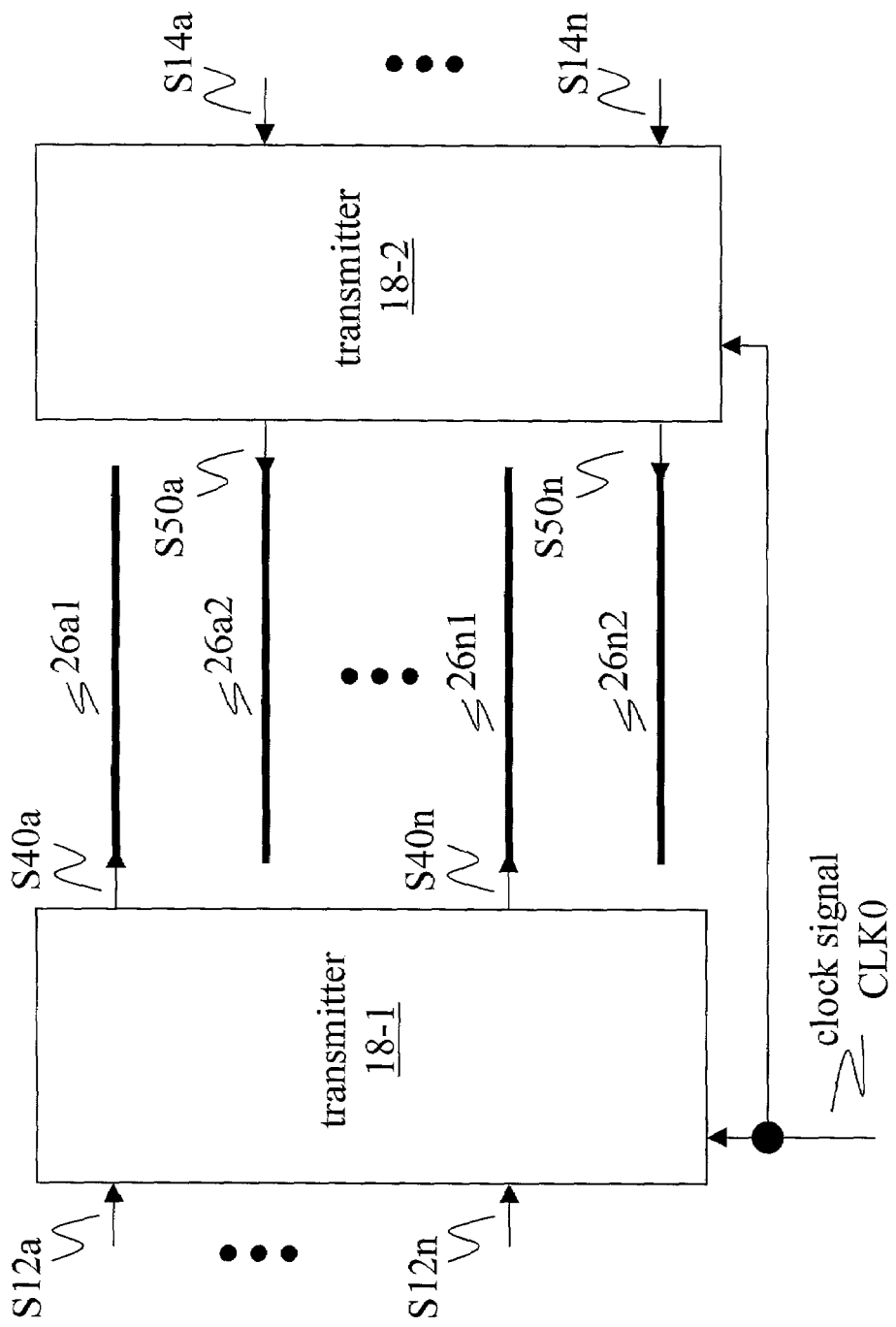
FIG. 29 is a block diagram showing an application of two instances 18-1 and 18-2 of an implementation 18 of a transmitter 10 according to an embodiment of the invention.

FIG. 29 shows a block diagram of an application of two instances 18-1, 18-2 of a transmitter according to an embodiment of the invention. In this application, each transmitter 18 transmits each output signal S40, S50 on a corresponding one of a set of conductive paths, each path including a parallel transmission line 26, such that lines carrying signals S40 are interleaved with lines carrying signals S50. Each transmitter 18 also receives the clock signal CLK0. In an exemplary application, transmitter 18 is an implementation of transmitter 10 as described above.

Figure 30:
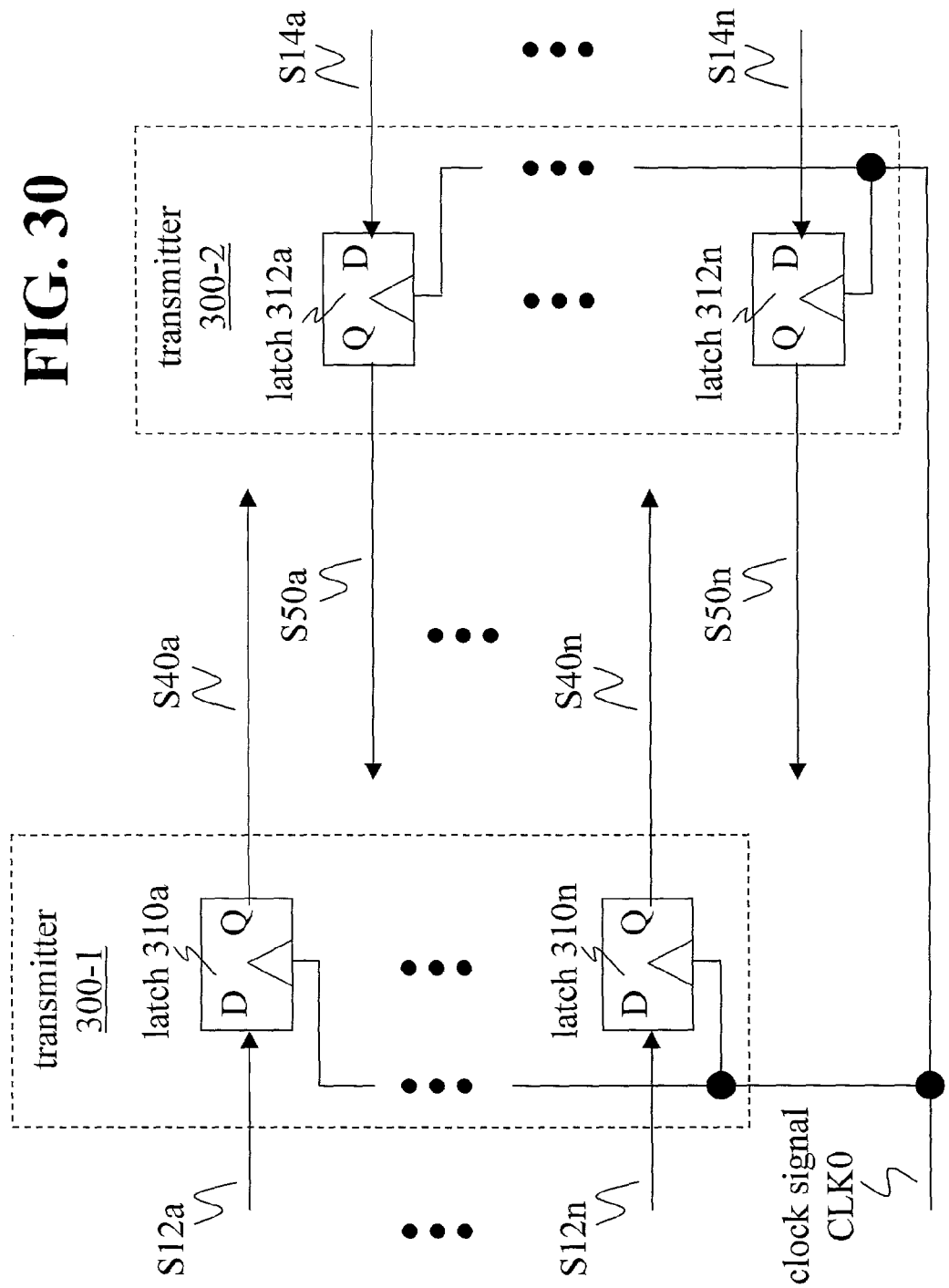
FIG. 30 is a block diagram showing an application of two instances 300-1 and 300-2 of an implementation 300 of a transmitter 10 according to an embodiment of the invention.

FIG. 30 shows implementations 300-1 and 300-2 of a transmitter according to an embodiment of the invention that are applied to receive clock signal CLK0 and input signals S12, S14 (where n is arbitrarily large) and to transmit corresponding output signals S40, S50 in an interleaved fashion (e.g. as shown in FIGS. 28 and 29) over conductive paths (not shown). Each among the sets of input signals S12, S14 may be similar to input signals S10 as described above. Each transmitter 300 includes a bank of latches 310, 312 that latch a value (e.g. state) received at an input onto an output upon a predetermined transition of clock signal CLK0.

In a system as shown in FIG. 30, it may be desirable to avoid sending data transitions in both directions at once. For example, it may be desirable for a time separation between transitions on an output signal (e.g. S40) to exceed the time required for the signal to propagate from one end of the corresponding conductive path to the other.

Figure 31:
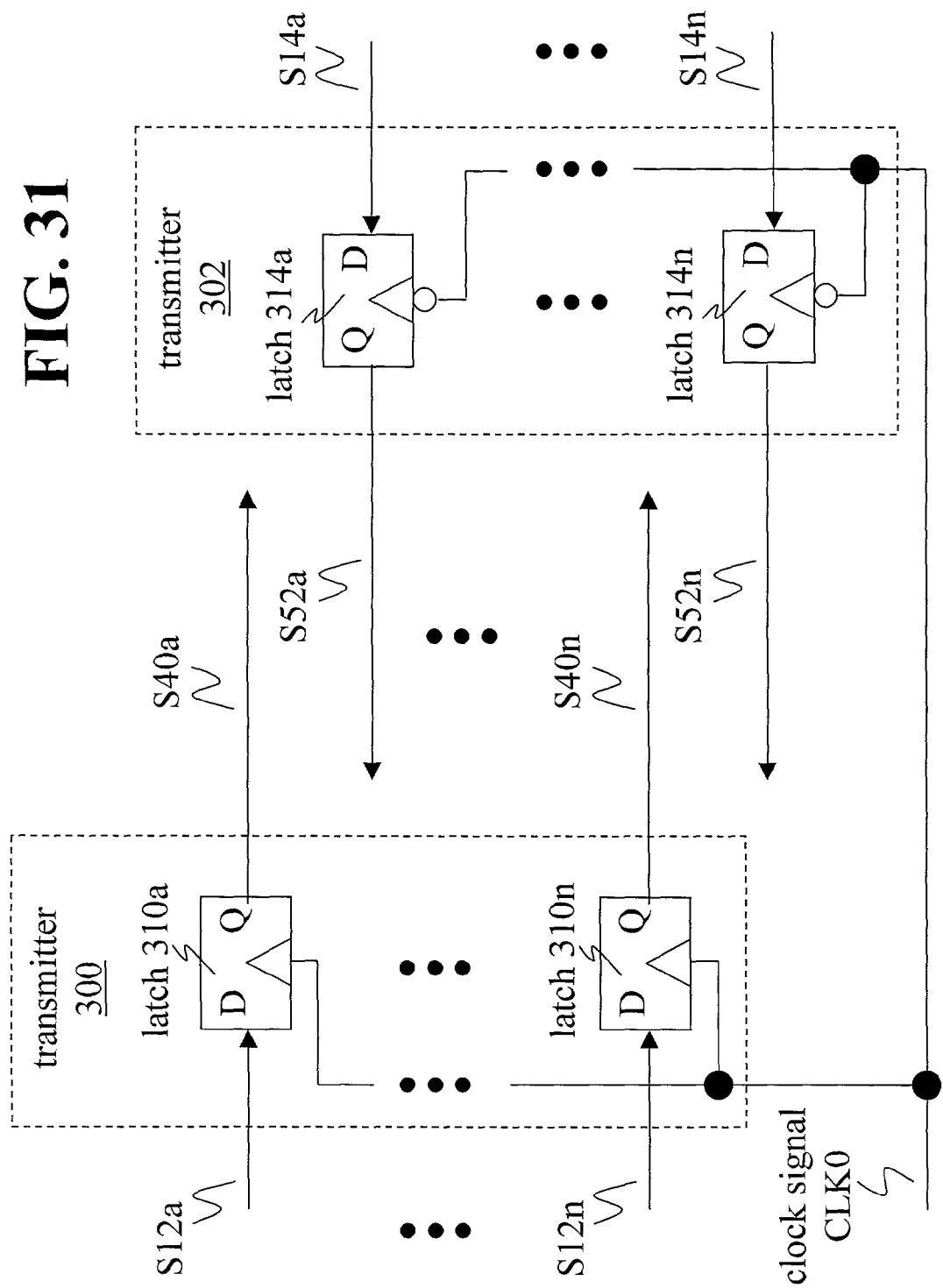
FIG. 31 is a block diagram showing an application of two implementations 300 and 302 of a transmitter 10 according to an embodiment of the invention.

A time separation between output signals S40 and S50 may be achieved at least in part as a consequence of an inherent delay in transmitting clock signal CLK0 (e.g. over one of a set of conductive paths 32 or parallel transmission lines 26) to transmitter 300-2. Alternatively, as shown in FIG. 31, such separation between output signals S40 and S52 may be achieved by arranging latches 310 of one transmitter 300 to latch upon one of the transitions (e.g. the rising or falling edges) of clock signal CLK0 and arranging latches 314 of the other transmitter 302 to latch upon the other transition of clock signal CLK0.

Figure 32:
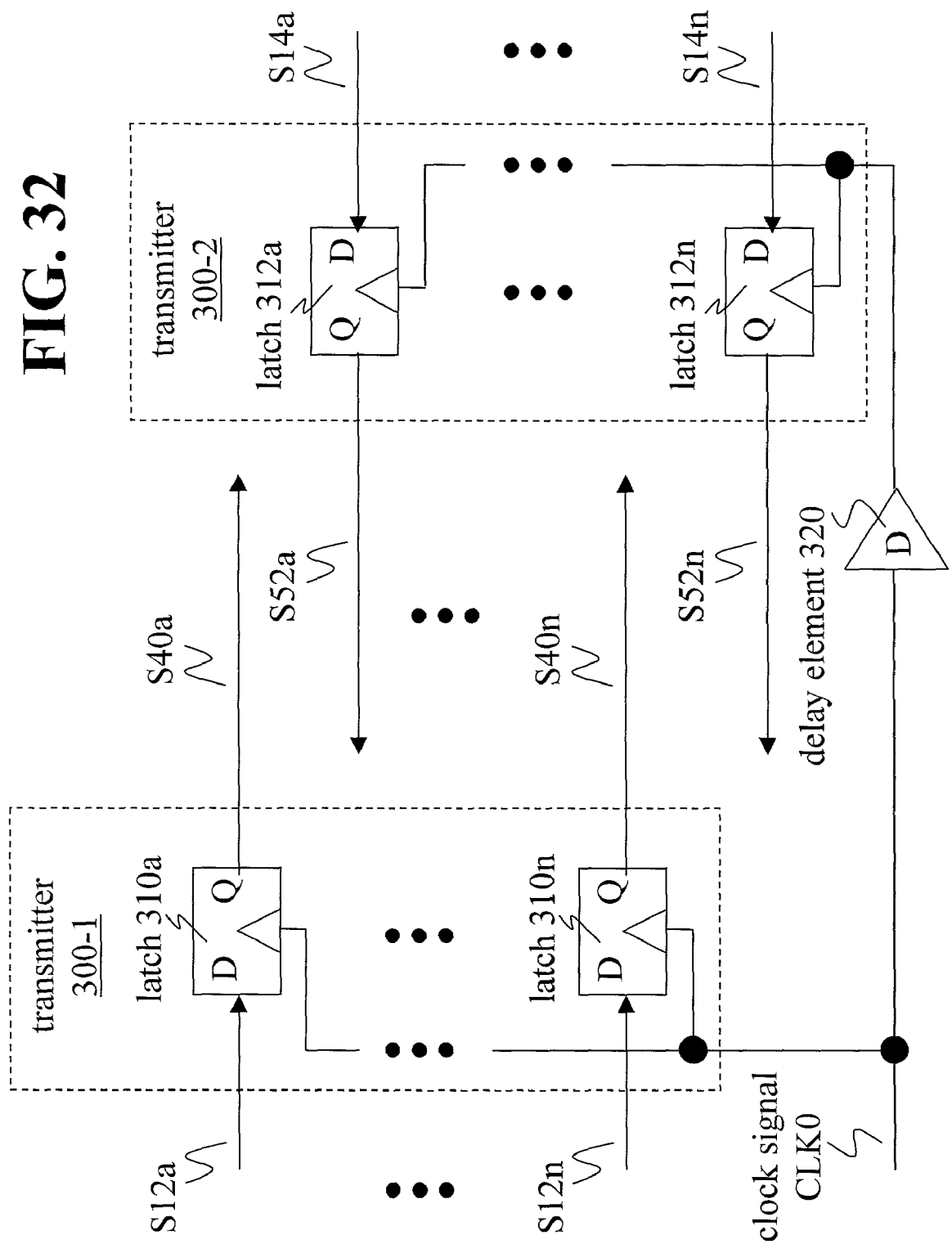
FIG. 32 is a block diagram showing an application of two instances 300-1 and 300-2 of an implementation 300 of a transmitter 10 according to an embodiment of the invention.

FIG. 32 shows a further application of transmitters 300-1 and 300-2 in which a difference in timing between output signals S40 and S52 is achieved at least in part by inserting a delay element 320 into the path of clock signal CLK0 to transmitter 300-2. Such a delay element, for example, may be incorporated into transmitter 300-2 and/or may receive clock signal CLK0 over one of a set of conductive paths carrying output signals S40, S52.

Figure 33:
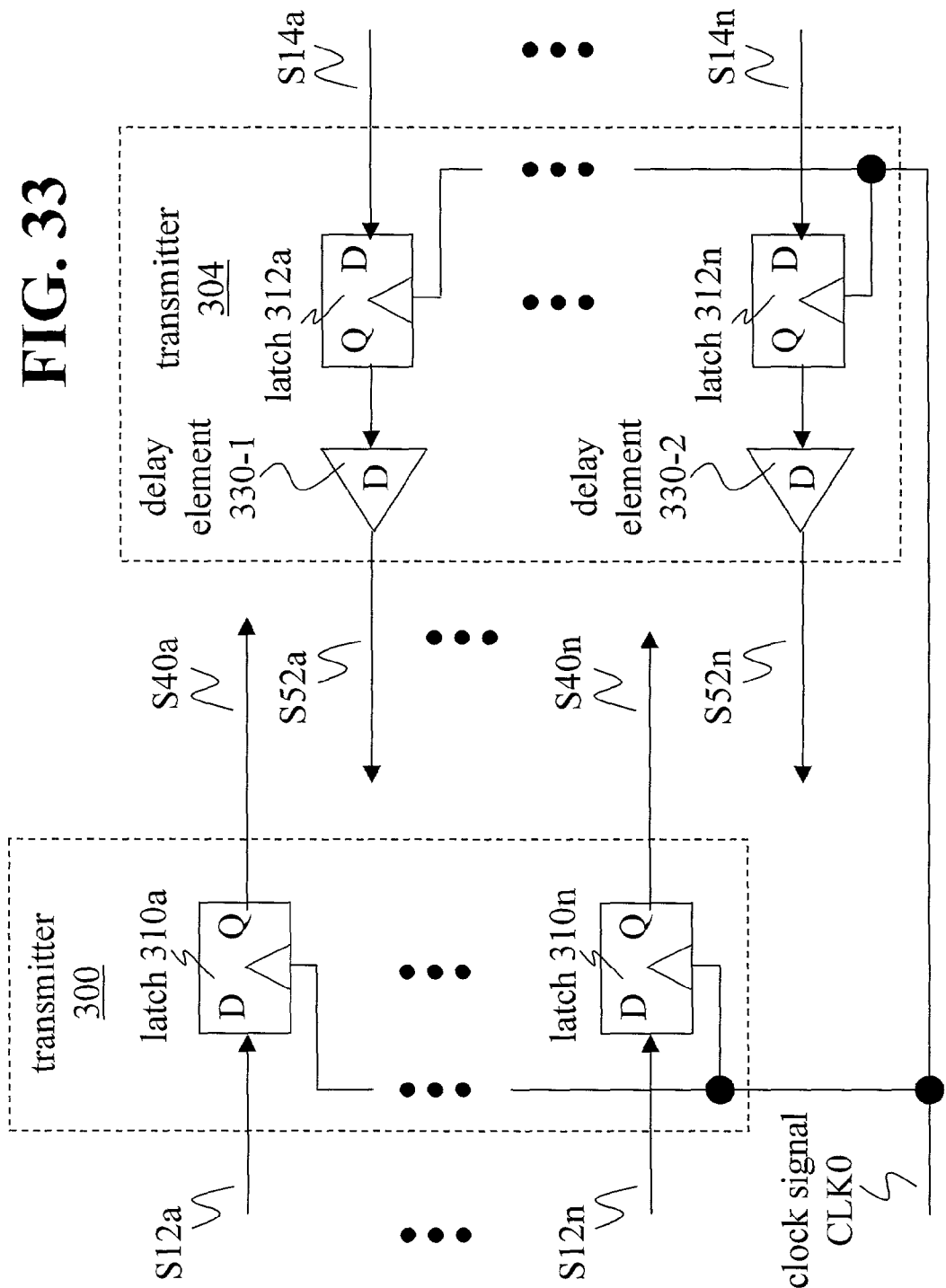
FIG. 33 is a block diagram showing an application of two implementations 300 and 304 of a transmitter 10 according to an embodiment of the invention.

FIG. 33 shows a block diagram of an application including implementations 300 and 304 of a transmitter according to an embodiment of the invention that are applied to receive input signals S12, S14 and transmit corresponding output signals S40, S52. In this case, the latch output signals of latches 312 are delayed by delay elements 330 before transmission over the conductive paths (not shown). Buffers as described above may also be optionally used with transmitter implementations as shown in FIGS. 28–33.

Figure 34:
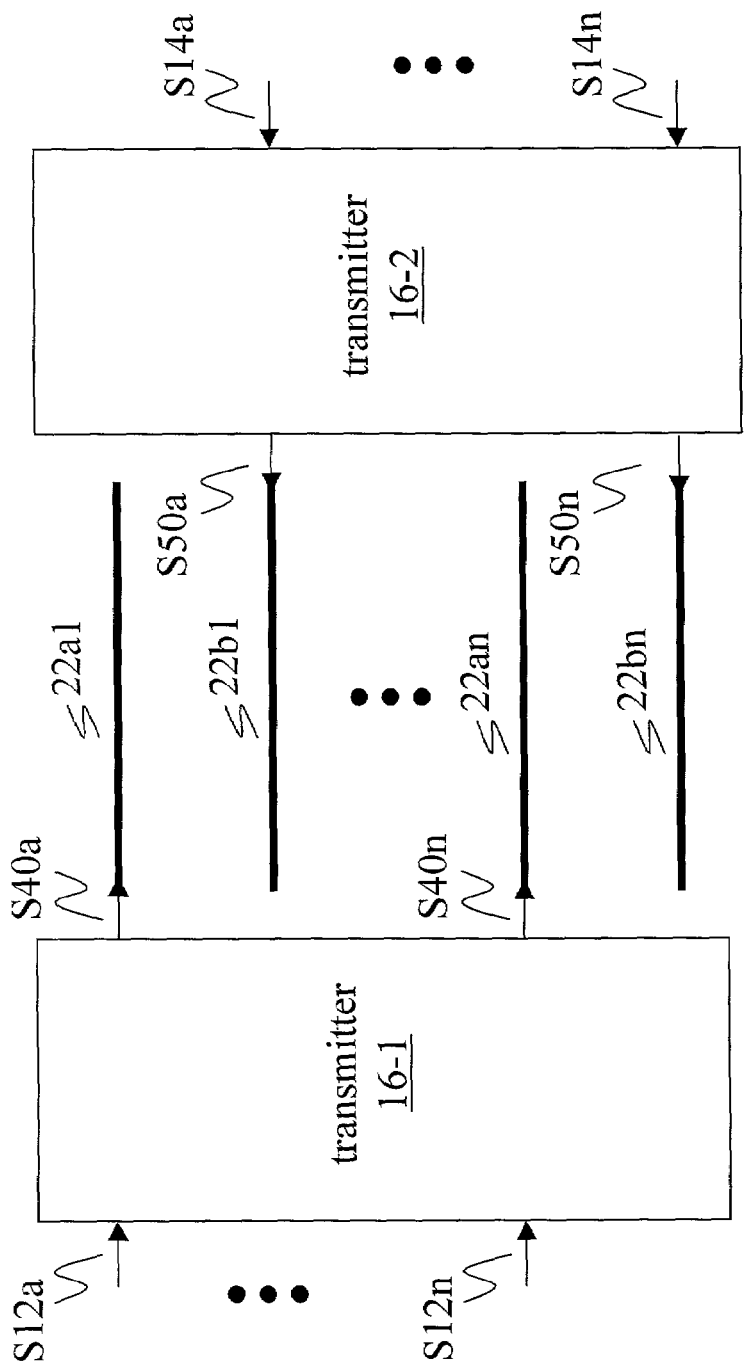
FIG. 34 is a block diagram showing an application of two instances 16-1 and 16-2 of an implementation 16 of a transmitter 10 according to an embodiment of the invention.
Figure 35:
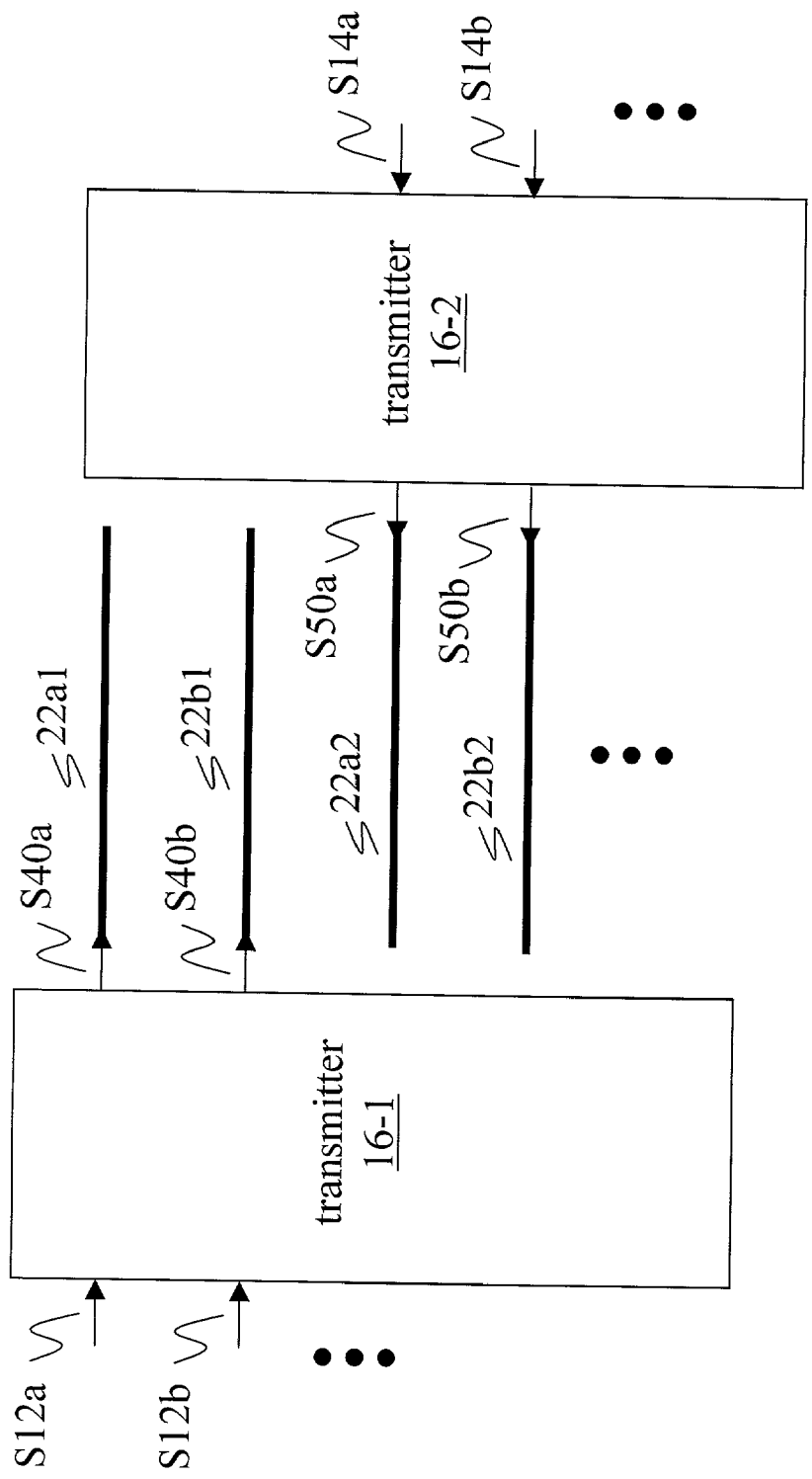
FIG. 35 is a block diagram showing an application of two instances 16-1 and 16-2 of an implementation 16 of a transmitter 10 according to an embodiment of the invention.

Data transitions may be further separated by combining a technique for passing signals on adjacent conductive paths through different alternating sequences of inversions and regenerations (e.g. as discussed above with reference to FIGS. 22–25) with a technique for transmitting signals on interleaved sets of parallel conductors (e.g. as discussed above with reference to FIGS. 28–33). To illustrate one such example, FIG. 34 shows a combination of a method according to an embodiment of the invention as shown in FIG. 28 with a method according to an embodiment of the invention as shown in FIG. 22. In this example, signals on adjacent transmission lines are transmitted in opposite directions, while adjacent transmission lines carrying signals in the same direction include different alternating series of inverting and non-inverting buffers. FIG. 35 shows another such combination in which the transmission lines 22 are arranged in alternating pairs, each pair carrying signals in the same direction through different alternating series of inverting and non-inverting buffers.

Figure 36:
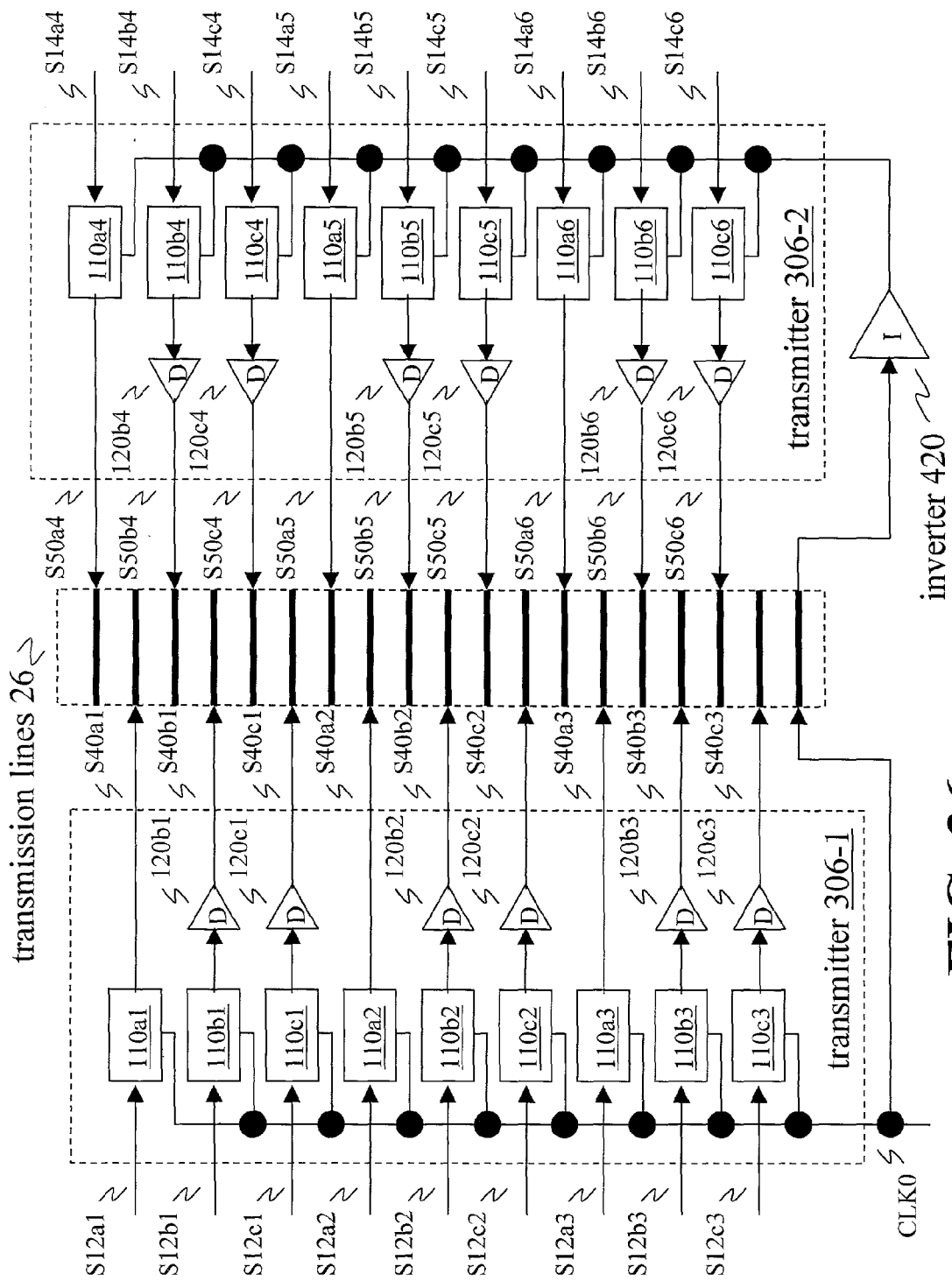
FIG. 36 is a block diagram showing an application of two instances 306-1 and 306-2 of an implementation 306 of a transmitter 10 according to an embodiment of the invention.

Similarly timed data transitions may be further separated in space by combining a technique for separation in time between data transitions on adjacent conductors (e.g. as discussed above with reference to FIGS. 1–16) with a technique for transmitting signals on interleaved sets of parallel conductors (e.g. as discussed above with reference to FIGS. 28–33). To illustrate one such example, FIG. 36 shows a combination of an application of a method according to an embodiment of the invention as shown in FIG. 10 with an application of a method according to an embodiment of the invention as shown in FIG. 29. This particular example also includes a delay element 320 as shown in FIG. 32 implemented as an inverter 420.

In the example shown in FIG. 36, the latches of transmitter 306-2 receive an inversion of clock signal CLK0. In another implementation, inverter 420 may be included within the transmission line or within one of the transmitters. In an alternate implementation, latches of one transmitter (e.g. latches 110$a$1–110$c$3 of transmitter 306-1) are configured to latch upon one of the transitions of clock signal CLK0, while latches of the other transmitter (e.g. latches 110$a$4–110$c$6 of transmitter 306-2) are configured to latch upon the other transition of clock signal CLK0 (e.g. as shown in FIG. 31).

Moreover, a technique for separation in time between data transitions on adjacent conductors (e.g. as discussed above with reference to FIGS. 1–16) may be combined with a technique for passing signals on adjacent conductive paths through different alternating sequences of inversions and regenerations (e.g. as discussed above with reference to FIGS. 22–25) and also with a technique for transmitting signals on interleaved sets of parallel conductors (e.g. as discussed above with reference to FIGS. 28–33).

Several different sequences of the individual conductive paths are possible for each such combination, e.g. as discussed with regard to the combinations described above. In one variation, for example, four adjacent conductive paths may carry differently timed signals in the same direction, while in another variation four adjacent conductive paths carry similarly timed signals in two different directions and through two different alternative sequences of inversions and regenerations. Simulations may be performed to determine the suitability of a particular combined scheme for a particular application.

The foregoing presentation of the described embodiments is provided to enable any person skilled in the art to make or use the present invention. Various modifications to these embodiments are possible, and the generic principles presented herein may be applied to other embodiments as well. For example, the invention may be implemented in part or in whole as a hard-wired circuit or as a circuit configuration fabricated into an application-specific integrated circuit. Thus, the present invention is not intended to be limited to the embodiments shown above but rather is to be accorded the widest scope consistent with the principles and novel features disclosed in any fashion herein.

What is claimed is:

1. A method of data transmission, said method comprising:
receiving a first set of input signals and a second set of input signals, each input signal having a series of state transitions synchronized to a data clock signal having a period T_CLK;
transmitting corresponding first and second sets of output signals such that each output signal (1) corresponds to an input signal of the corresponding set, (2) passes along a corresponding one of a corresponding set of a plurality of conductive paths, and (3) has a series of state transitions corresponding to the series of state transitions of the corresponding input signal;
transmitting each among a third set of output signals on a corresponding one of a third set of the plurality of conductive paths; and
transmitting each among a fourth set of output signals on a corresponding one of a fourth set of the plurality of conductive paths,
wherein adjacent conductive paths of the first set are separated by at least one conductive path of the third set, and
wherein adjacent conductive paths of the second set are separated by at least one conductive path of the fourth set, and
wherein a time between a state transition on an input signal of the first set and the corresponding state transition on the corresponding output signal exceeds a time between a state transition on an input signal of the second set and the corresponding state transition on the corresponding output signal by a delay period T_DLY, and
wherein the period T_CLK is greater than the delay period T_DLY, and
wherein a first of two ends of each one among the plurality of conductive paths is closer to the first end of an adjacent conductive path than to the second end of the adjacent conductive path, and
wherein said transmitting each among the first and second sets of signals includes applying the signal to the first end of the corresponding conductive path, and wherein said transmitting each among the third and fourth sets of signals includes applying the signal to the second end of the corresponding conductive path.

2. The method of data transmission according to claim 1, wherein adjacent conductive paths of the first set are separated by at least one conductive path of the second set.

3. The method of data transmission according to claim 1, wherein the conductive paths of the plurality of conductive paths are substantially parallel to one another.

4. The method of data transmission according to claim 1, wherein transmitting each among a first, second, third, and fourth set of output signals occurs on the same semiconductor substrate.

5. The method of data transmission according to claim 4, wherein a length of each of the plurality of conductive paths is at least five centimeters.

6. The method of data transmission according to claim 1, said method further comprising transmitting a clock signal across one of the plurality of conductive paths, and
wherein each among the first set of output signals includes a series of state transitions synchronized to the clock signal.

7. The method of data transmission according to claim 1, wherein at least one among the first set of the plurality of conductive paths includes a first alternating sequence of inversions and regenerations, and wherein at least one among the second set of the plurality of conductive paths includes a second alternating sequence of inversions and regenerations, said second sequence being opposite to the first sequence.

8. A method of data transmission, said method comprising:
transmitting each among a first set of signals on a corresponding one of a first set of a plurality of conductive paths;
transmitting each among a second set of signals on a corresponding one of a second set of the plurality of conductive paths;
transmitting each among a third set of signals on a corresponding one of a third set of the plurality of conductive paths; and
transmitting each among a fourth set of signals on a corresponding one of a fourth set of the plurality of conductive paths,
wherein adjacent conductive paths of the first set are separated by at least one conductive path of the third set, and
wherein adjacent conductive paths of the second set are separated by at least one conductive path of the fourth set, and
wherein a first of two ends of each one among the plurality of conductive paths is closer to the first end of an adjacent conductive path than to the second end of the adjacent conductive path, and
wherein said transmitting each among the first and second sets of signals includes applying the signal to the first end of the corresponding conductive path, and wherein said transmitting each among the third and fourth sets of signals includes applying the signal to the second end of the corresponding conductive path, and
wherein at least one among the first set of conductive paths includes a first alternating sequence of inversions and regenerations, and
wherein at least one among the second set of conductive paths includes a second alternating sequence of inversions and regenerations, said second sequence being opposite to the first sequence.

9. The method of data transmission according to claim 8, wherein the conductive paths of the plurality of conductive paths are substantially parallel to one another.

10. The method of data transmission according to claim 8, wherein adjacent conductive paths of the first set are separated by at least one conductive path of the second set.

11. The method of data transmission according to claim 8, wherein transmitting each among a first, second, third, and fourth set of output signals occurs on the same semiconductor substrate.

12. The method of data transmission according to claim 11, wherein a length of each of the plurality of conductive paths is at least five centimeters.

13. The method of data transmission according to claim 8, said method further comprising transmitting a clock signal across one of the plurality of conductive paths, and
wherein each among the first set of output signals includes a series of state transitions synchronized to the clock signal.

14. A method of data transmission, said method comprising:
receiving a first set of input signals and a second set of input signals, each input signal having a series of state transitions synchronized to a data clock signal having a period T_CLK; and
transmitting corresponding first and second sets of output signals such that each output signal (1) corresponds to an input signal of the corresponding set, (2) passes along a corresponding one of a corresponding set of a plurality of conductive paths, and (3) has a series of state transitions corresponding to the series of state transitions of the corresponding input signal,
wherein a time between a state transition on an input signal of the first set and the corresponding state transition on the corresponding output signal exceeds a time between a state transition on an input signal of the second set and the corresponding state transition on the corresponding output signal by a delay period T_DLY, and
wherein the period T_CLK is greater than the delay period T_DLY, and
wherein adjacent conductive paths that each carry an output signal of the first set are separated by at least one conductive path that carries an output signal of the second set, and
wherein at least one among the first set of conductive paths includes a first alternating sequence of inversions and regenerations, and
wherein at least one among the second set of conductive paths includes a second alternating sequence of inversions and regenerations, said second sequence being opposite to the first sequence.

15. The method of data transmission according to claim 14, wherein the conductive paths of the plurality of conductive paths are substantially parallel to one another.

16. The method of data transmission according to claim 14, wherein transmitting each among the first and second sets of output signals occurs on the same semiconductor substrate.

17. The method of data transmission according to claim 16, wherein a length of each of the plurality of conductive paths is at least five centimeters.

18. The method of data transmission according to claim 14, said method further comprising transmitting a clock signal across one of the plurality of conductive paths, and
wherein each among the first set of output signals includes a series of state transitions synchronized to the clock signal.

19. A system for data transmission, said system comprising:
a plurality of conductive paths;
a first transmitter configured and arranged to receive a first set of input signals and a second set of input signals and to transmit corresponding first and second sets of output signals; and
a second transmitter configured and arranged to receive a third set of input signals and a fourth set of input signals and to transmit corresponding third and fourth sets of output signals,
wherein each input signal has a series of state transitions and each output signal has a series of state transitions corresponding to the series of state transitions of the corresponding input signal, and
wherein a first of two ends of each one among the plurality of conductive paths is closer to the first end of an adjacent conductive path than to the second end of the adjacent conductive path, and
wherein the first transmitter is further configured and arranged to apply each first output signal to the first end of a corresponding one of a first set of the plurality of conductive paths and to apply each second output signal to the first end of a corresponding one of a second set of the plurality of conductive paths, and
wherein the second transmitter is further configured and arranged to apply each third output signal to the second end of a corresponding one of a third set of the plurality of conductive paths and to apply each fourth output signal to the second end of a corresponding one of a fourth set of the plurality of conductive paths, and wherein adjacent conductive paths carrying output signals of the first set are separated by at least one conductive path carrying an output signal of the third set, and wherein each one among the plurality of conductive paths includes a corresponding one of a plurality of parallel transmission lines, and wherein at least one among the first set of the plurality of parallel transmission lines includes a first alternating series of inverting and non-inverting buffers, and wherein at least one among the second set of the plurality of conductive paths includes a second alternating series of inverting and non-inverting buffers, and wherein the sequence of inverting and non-inverting buffers in the second alternating series is opposite to the sequence of inverting and non-inverting buffers in the first alternating series.

20. The system for data transmission according to claim 19, wherein the conductive paths of the plurality of conductive paths are substantially parallel to one another.

21. The system for data transmission according to claim 19, wherein the first and second transmitters are fabricated on the same semiconductor substrate.

22. The system for data transmission according to claim 21, wherein a length of each of the conductive paths is at least five centimeters.

23. The system for data transmission according to claim 19, wherein each of the first and second transmitters is further configured and arranged to receive an operating voltage from two power rails, and wherein the two power rails are parallel to and on opposite sides of the plurality of conductive paths.

24. The system for data transmission according to claim 19, wherein the first transmitter is further configured and arranged to couple a clock signal to one of the plurality of parallel transmission lines, and wherein each among the first set of output signals includes a series of state transitions synchronized to the clock signal.

25. A system for data transmission, said system including:

a plurality of conductive paths; and a data transmitter configured and arranged to receive a plurality of input signals, each having a series of state transitions synchronized to a data clock signal having a period T_CLK, and to transmit a plurality of first output signals and a plurality of second output signals, wherein each of the first and second output signals corresponds to a different one of the input signals and has a series of state transitions corresponding to the series of state transitions of the corresponding input signal, and wherein the data transmitter is further configured and arranged to transmit each of the first and second output signals along a corresponding one of a corresponding set of the plurality of conductive paths, and wherein a time between a state transition on an input signal and a corresponding state transition on a corresponding second output signal exceeds a time between a state transition on an input signal and a corresponding state transition on a corresponding first output signal by a delay period T_DLY, and wherein the time period T_CLK is greater than the delay period T_DLY, and wherein adjacent conductive paths of the first set are separated by a conductive path of the second set, and wherein each one among the plurality of conductive paths includes a corresponding one of a plurality of parallel transmission lines, and wherein at least one among the first set of the plurality of parallel transmission lines includes a first alternating series of inverting and non-inverting buffers, and wherein at least one among the second set of the plurality of conductive paths includes a second alternating series of inverting and non-inverting buffers, and wherein the sequence of inverting and non-inverting buffers in the second alternating series is opposite to the sequence of inverting and non-inverting buffers in the first alternating series.

26. The system for data transmission according to claim 25, wherein the conductive paths of the plurality of conductive paths are substantially parallel to one another.

27. The system for data transmission according to claim 25, wherein the first and second transmitters are fabricated on the same semiconductor substrate.

28. The system for data transmission according to claim 27, wherein a length of each of the conductive paths is at least five centimeters.

29. The system for data transmission according to claim 25, wherein each of the first and second transmitters is further configured and arranged to receive an operating voltage from two power rails, and wherein the two power rails are parallel to and on opposite sides of the plurality of conductive paths.

30. The system for data transmission according to claim 25, wherein the first transmitter is further configured and arranged to couple a clock signal to one of the plurality of parallel transmission lines, and wherein each among the first set of output signals includes a series of state transitions synchronized to the clock signal.

31. The system for data transmission according to claim 25, wherein the delay period T_DLY is at least twice as long as a rise time of the data clock signal.

32. A system for data transmission, said system including:

a plurality of conductive paths; and a first data transmitter configured and arranged to receive a plurality of input signals, each having a series of state transitions synchronized to a data clock signal having a period T_CLK, and to transmit a plurality of first output signals and a plurality of second output signals; and a second data transmitter configured and arranged to receive a plurality of input signals, each having a series of state transitions synchronized to a data clock signal, and to transmit a plurality of third output signals and a plurality of fourth output signals, wherein each of the first, second, third, and fourth output signals corresponds to a different one of the input signals and has a series of state transitions corresponding to the series of state transitions of the corresponding input signal, and wherein the first and second data transmitters are further configured and arranged to transmit each of the first, second, third, and fourth output signals along a corresponding one of a corresponding set of the plurality of conductive paths, and wherein a time between a state transition on an input signal and a corresponding state transition on a corresponding second output signal exceeds a time between a state transition on an input signal and a corresponding state transition on a corresponding first output signal by a delay period T_DLY, and wherein the time period T_CLK is greater than the delay period T_DLY, and wherein adjacent conductive paths of the first set are separated by a conductive path of the third set, and wherein a first of two ends of each one among the plurality of conductive paths is closer to the first end of an adjacent conductive path than to the second end of the adjacent conductive path, and wherein the first data transmitter is configured and arranged to apply each first and second output signal to the first end of the corresponding conductive path, and wherein the second data transmitter is configured and arranged to apply each third and fourth output signal to the second end of the corresponding conductive path.

33. The system for data transmission according to claim 32, wherein the first and second transmitters are fabricated on the same semiconductor substrate.

34. The system for data transmission according to claim 33, wherein a length of each of the conductive paths is at least five centimeters.

35. The system for data transmission according to claim 32, wherein each of the first and second transmitters is further configured and arranged to receive an operating voltage from two power rails, and wherein the two power rails are parallel to and on opposite sides of the plurality of conductive paths.

36. The system for data transmission according to claim 32, wherein each one among the plurality of conductive paths includes a corresponding one of a plurality of parallel transmission lines, and wherein the first transmitter is further configured and arranged to couple a clock signal to one of the plurality of parallel transmission lines, and wherein each among the first set of output signals includes a series of state transitions synchronized to the clock signal.

37. The system for data transmission according to claim 32, wherein each one among the plurality of conductive paths includes a corresponding one of a plurality of transmission lines, and wherein at least one among the first set of the plurality of parallel transmission lines includes a first alternating series of inverting and non-inverting buffers, and wherein at least one among the second set of the plurality of conductive paths includes a second alternating series of inverting and non-inverting buffers, and wherein the sequence of inverting and non-inverting buffers in the second alternating series is opposite to the sequence of inverting and non-inverting buffers in the first alternating series.

38. A data transmitter configured and arranged to receive a plurality of input signals and to transmit a plurality of first output signals and a plurality of second output signals, each of the first and second output signals corresponding to a different one of the input signals and each being transmitted along a corresponding one of a corresponding set of the plurality of conductive paths, said data transmitter comprising:

a plurality of first latches, each having (1) a clock input configured and arranged to receive a first clock signal including a series of first transitions, with consecutive first transitions being separated by a time period T_CLK, (2) a latch input configured and arranged to receive a corresponding one of the input signals, and (3) an latch output configured and arranged to produce a corresponding latch signal, each first latch being further configured and arranged to latch a data value from the corresponding input signal to the corresponding latch signal upon each first transition; and a plurality of second latches, each having (1) a clock input configured and arranged to receive a second clock signal based on the first clock signal and including a series of second transitions, with consecutive second transitions being separated by a time period T_CLK, (2) a latch input configured and arranged to receive a corresponding input signal, and (3) a latch output configured and arranged to produce a corresponding latch signal, each second latch being further configured and arranged to latch a data value from the corresponding input signal to the corresponding latch signal upon each second transition;

wherein each first output signal is based on a latch signal of a different one of the first latches and each second output signal is based on a latch signal of a different one of the second latches, and wherein a time between a transition on an input signal and a corresponding transition on a corresponding second output signal exceeds a time between a transition on an input signal and a corresponding transition on a corresponding first output signal by a delay period T_DLY, and wherein the time period T_CLK is greater than the delay period T_DLY, and wherein adjacent conductive paths of the first set are separated by a conductive path of the second set, and wherein each one among the plurality of conductive paths includes a corresponding one of a plurality of parallel transmission lines, and wherein at least one among the first set of the plurality of parallel transmission lines includes a first alternating series of inverting and non-inverting buffers, and wherein at least one among the second set of the plurality of conductive paths includes a second alternating series of inverting and non-inverting buffers, and wherein the sequence of inverting and non-inverting buffers in the second alternating series is opposite to the sequence of inverting and non-inverting buffers in the first alternating series.

39. The data transmitter according to claim 38, wherein the conductive paths of the plurality of conductive paths are substantially parallel to one another.

40. The data transmitter according to claim 38, wherein the first and second transmitters are fabricated on the same semiconductor substrate.

41. The data transmitter according to claim 40, wherein a length of each of the conductive paths is at least five centimeters.

42. The data transmitter according to claim 38, said data transmitter further comprising two power rails, wherein the data transmitter is further configured and arranged to receive an operating voltage from the two power rails, and wherein the two power rails extend parallel and adjacent to, and on opposite sides of, the plurality of conductive paths.

43. The data transmitter according to claim 38, wherein the first transmitter is further configured and arranged to couple a clock signal to one of the plurality of parallel transmission lines, and wherein each among the first set of output signals includes a series of state transitions synchronized to the clock signal.

44. The data transmitter according to claim 38, wherein the delay period T_DLY is at least twice as long as a rise time of the data clock signal.

* * * * *